(12) United States Patent
Cheng

(10) Patent No.: US 11,699,735 B2
(45) Date of Patent: Jul. 11, 2023

(54) GATE STRUCTURE AND METHOD

(71) Applicant: Taiwan Semiconductor Manufacturing Co., Ltd., Hsinchu (TW)

(72) Inventor: Chung-Liang Cheng, Hsinchu (TW)

(73) Assignee: Taiwan Semiconductor Manufacturing Co., Ltd., Hsinchu (TW)

( * ) Notice: Subject to any disclaimer, the term of this patent is extended or adjusted under 35 U.S.C. 154(b) by 199 days.

(21) Appl. No.: 17/190,888

(22) Filed: Mar. 3, 2021

(65) Prior Publication Data

US 2021/0384313 A1 Dec. 9, 2021

Related U.S. Application Data

(60) Provisional application No. 63/035,408, filed on Jun. 5, 2020.

(51) Int. Cl.
| | | |
|---|---|---|
| *H01L 29/49* | (2006.01) | |
| *H01L 29/51* | (2006.01) | |
| *H01L 29/423* | (2006.01) | |
| *H01L 29/40* | (2006.01) | |
| *H01L 29/06* | (2006.01) | |
| *H01L 29/66* | (2006.01) | |
| *H01L 29/786* | (2006.01) | |

(Continued)

(52) U.S. Cl.
CPC .. *H01L 29/4908* (2013.01); *H01L 21/823807* (2013.01); *H01L 21/823857* (2013.01); *H01L 27/092* (2013.01); *H01L 29/0665* (2013.01); *H01L 29/401* (2013.01); *H01L 29/42364* (2013.01); *H01L 29/42392* (2013.01); *H01L 29/511* (2013.01); *H01L 29/66742* (2013.01); *H01L 29/78696* (2013.01)

(58) Field of Classification Search
CPC ......... H01L 29/4908; H01L 21/823807; H01L 21/823857; H01L 27/092; H01L 29/0665; H01L 29/401; H01L 29/42364; H01L 29/42392; H01L 29/511; H01L 29/66742; H01L 29/78696; H01L 29/0673; H01L 21/28185; H01L 27/088; H01L 29/512; H01L 29/66439; H01L 21/823842; H01L 21/823462; H01L 29/775; B82Y 10/00
USPC ...................................................... 257/288
See application file for complete search history.

(56) References Cited

U.S. PATENT DOCUMENTS

| | | |
|---|---|---|
| 9,236,267 B2 | 1/2016 | De et al. |
| 9,502,265 B1 | 11/2016 | Jiang et al. |
| 9,520,466 B2 | 12/2016 | Holland et al. |

(Continued)

FOREIGN PATENT DOCUMENTS

| | | |
|---|---|---|
| KR | 10-2007-0046201 A | 5/2007 |
| KR | 10-2013-0022882 A | 3/2013 |

(Continued)

*Primary Examiner* — Tong-Ho Kim
(74) *Attorney, Agent, or Firm* — Seed IP Law Group

(57) ABSTRACT

A device comprises a substrate, a semiconductor channel over the substrate, and a gate structure over and laterally surrounding the semiconductor channel. The gate structure comprises a first dielectric layer comprising a first dielectric material including dopants. A second dielectric layer is on the first dielectric layer, and comprises a second dielectric material substantially free of the dopants. A metal fill layer is over the second dielectric layer.

20 Claims, 25 Drawing Sheets

(51) Int. Cl.
*H01L 27/092* (2006.01)
*H01L 21/8238* (2006.01)

(56) References Cited

U.S. PATENT DOCUMENTS

| | | |
|---|---|---|
| 9,520,482 B1 | 12/2016 | Chang et al. |
| 9,536,738 B2 | 1/2017 | Huang et al. |
| 9,576,814 B2 | 2/2017 | Wu et al. |
| 9,608,116 B2 | 3/2017 | Ching et al. |
| 9,786,774 B2 | 10/2017 | Colinge et al. |
| 9,853,101 B2 | 12/2017 | Peng et al. |
| 9,881,993 B2 | 1/2018 | Ching et al. |
| 2012/0049297 A1 | 3/2012 | Takeoka |
| 2017/0221898 A1* | 8/2017 | Ando .................... H01L 29/785 |
| 2019/0067125 A1 | 2/2019 | Chiang et al. |
| 2019/0148237 A1 | 5/2019 | Wang |
| 2020/0119019 A1 | 4/2020 | Tsai et al. |
| 2021/0098457 A1* | 4/2021 | Cheng .................. H01L 29/785 |
| 2021/0391225 A1* | 12/2021 | Cheng .................. H01L 27/092 |

FOREIGN PATENT DOCUMENTS

| | | |
|---|---|---|
| KR | 10-2019-0024600 A | 3/2019 |
| TW | 201933446 A | 8/2019 |
| TW | 202013519 A | 4/2020 |
| WO | 2006036671 A1 | 4/2006 |

\* cited by examiner

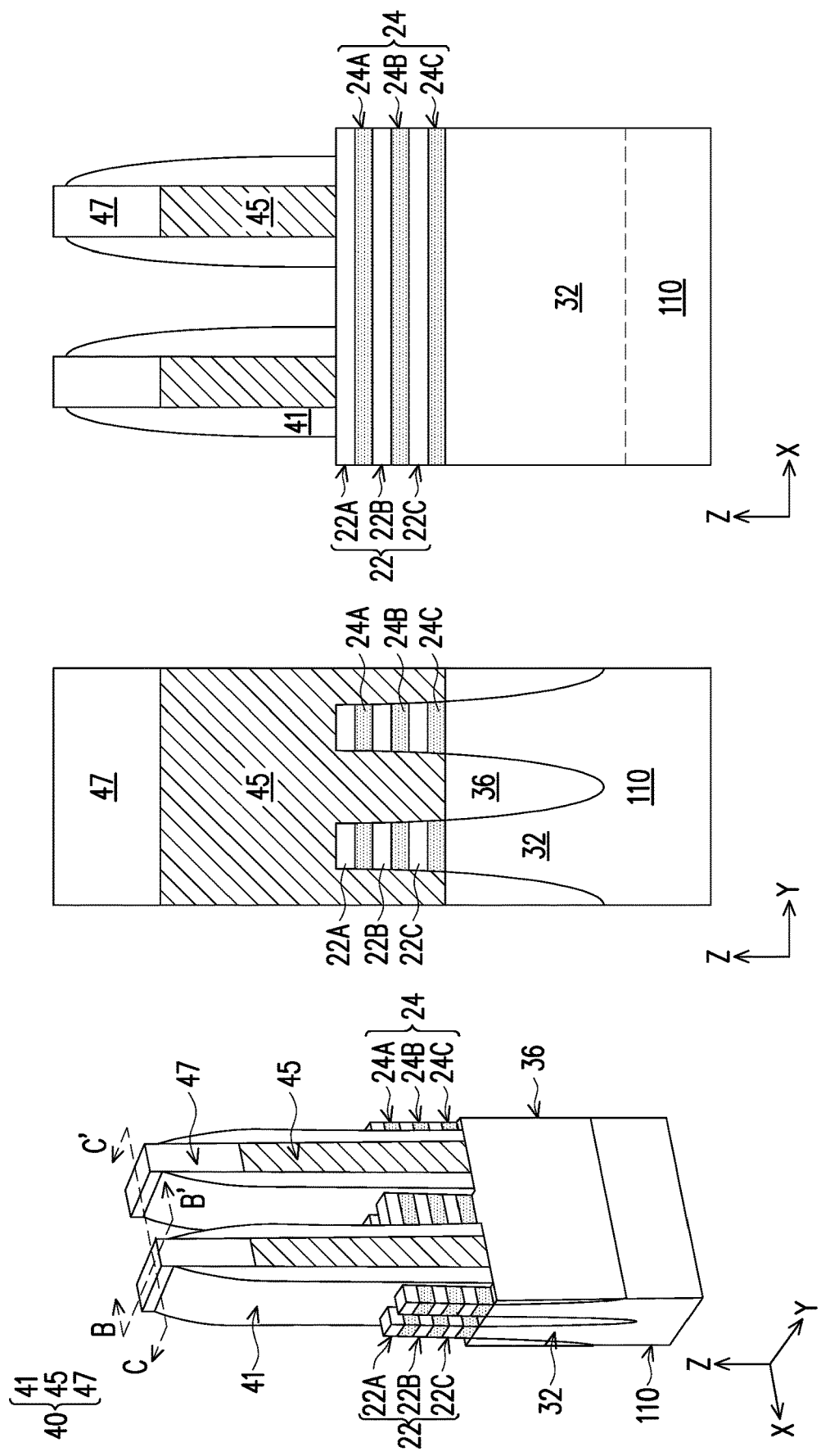

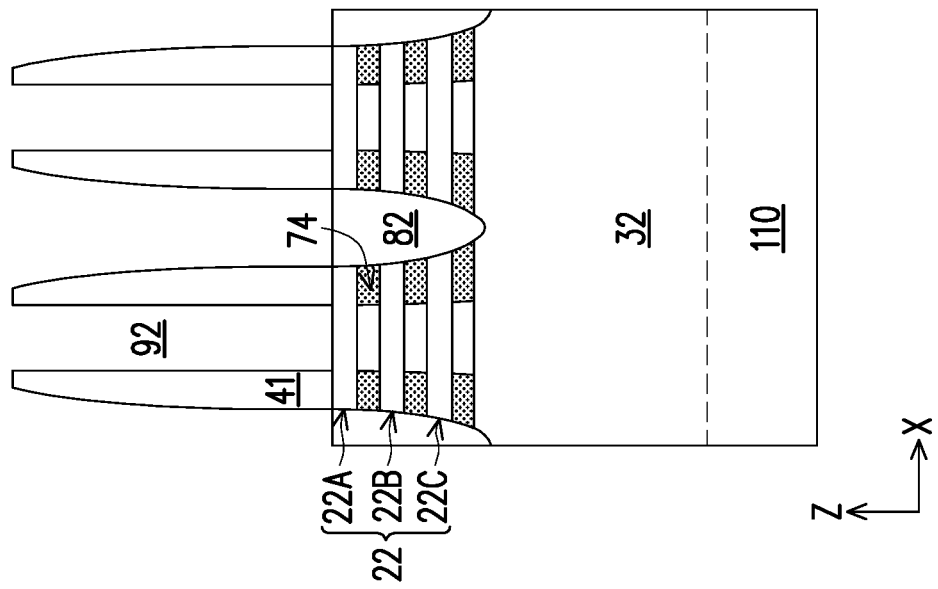
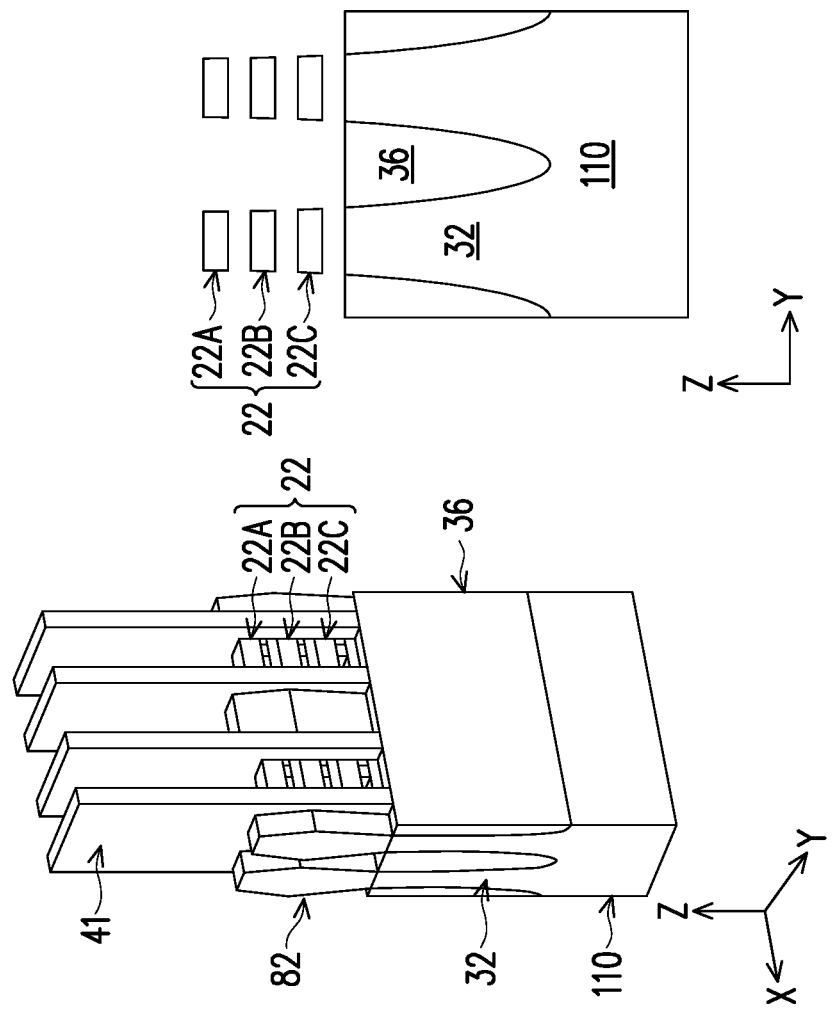
FIG. 9C  FIG. 9B  FIG. 9A

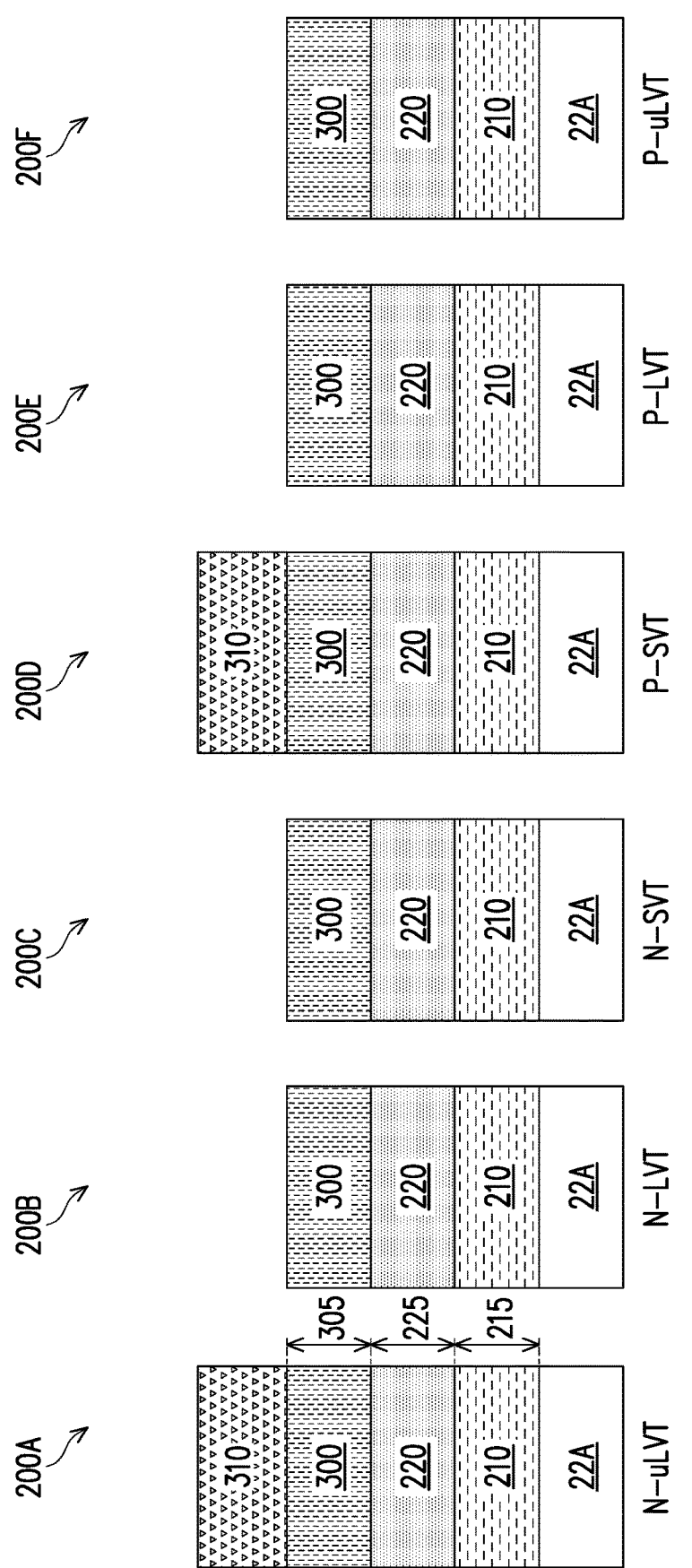

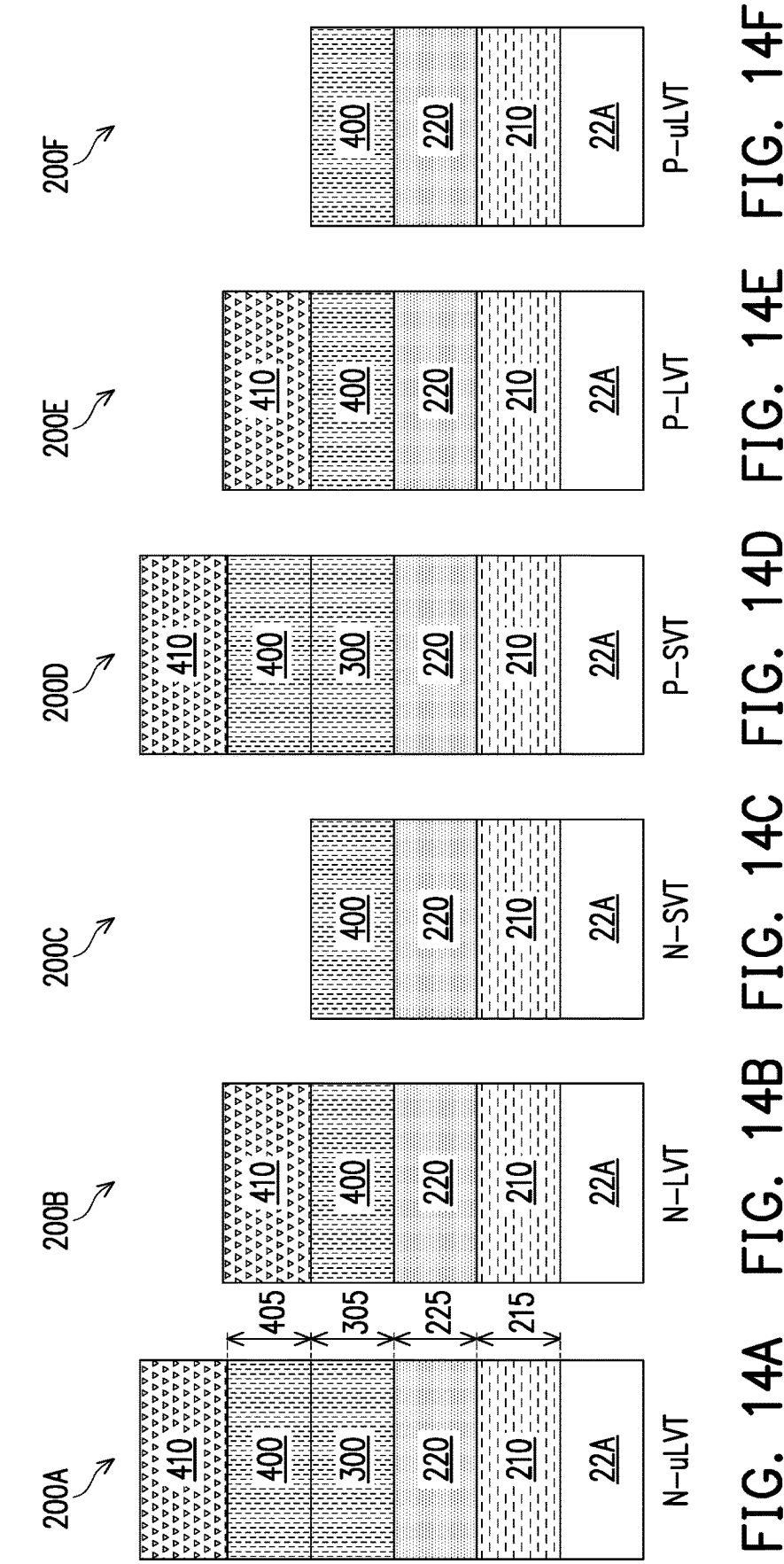

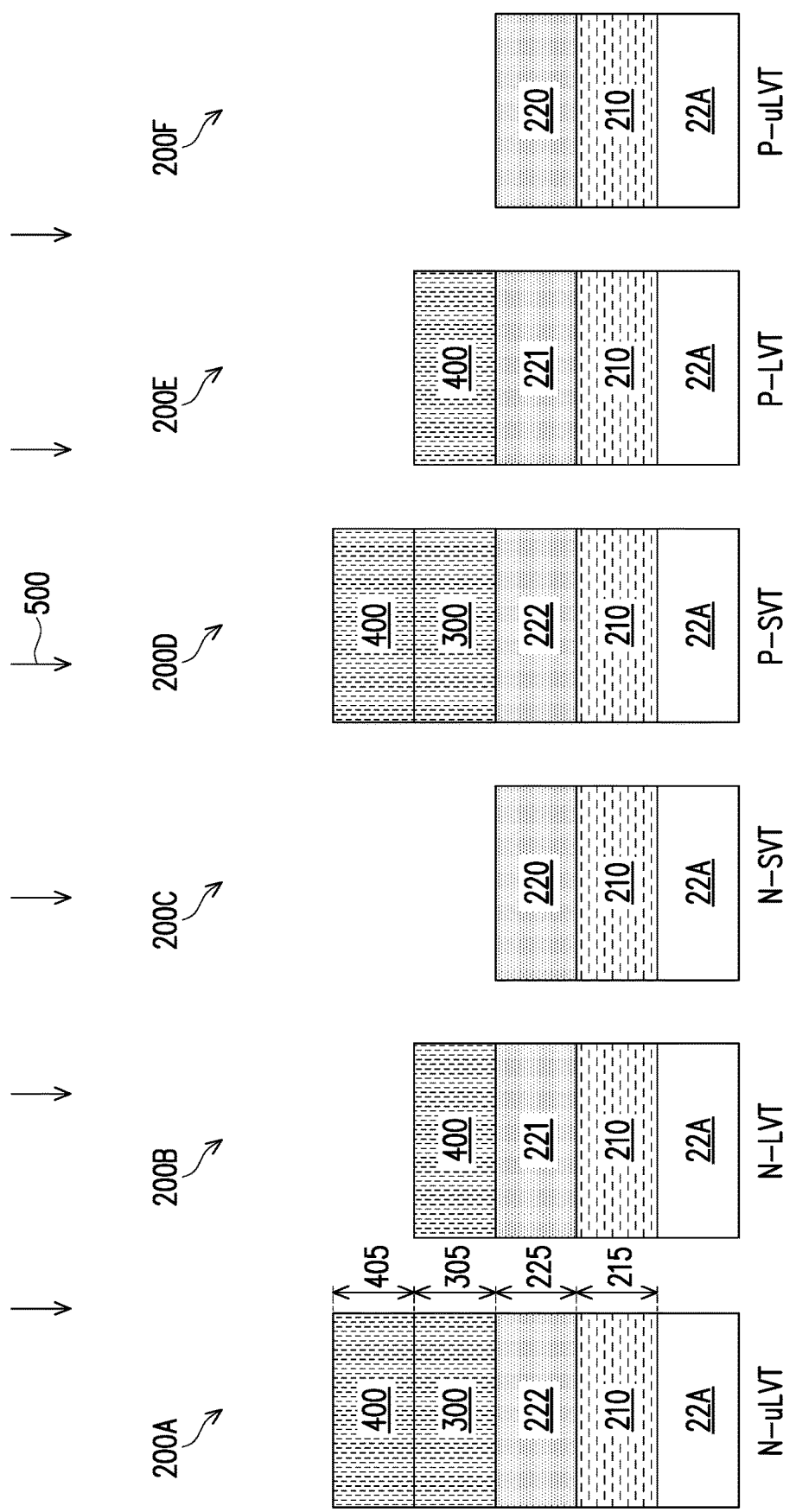

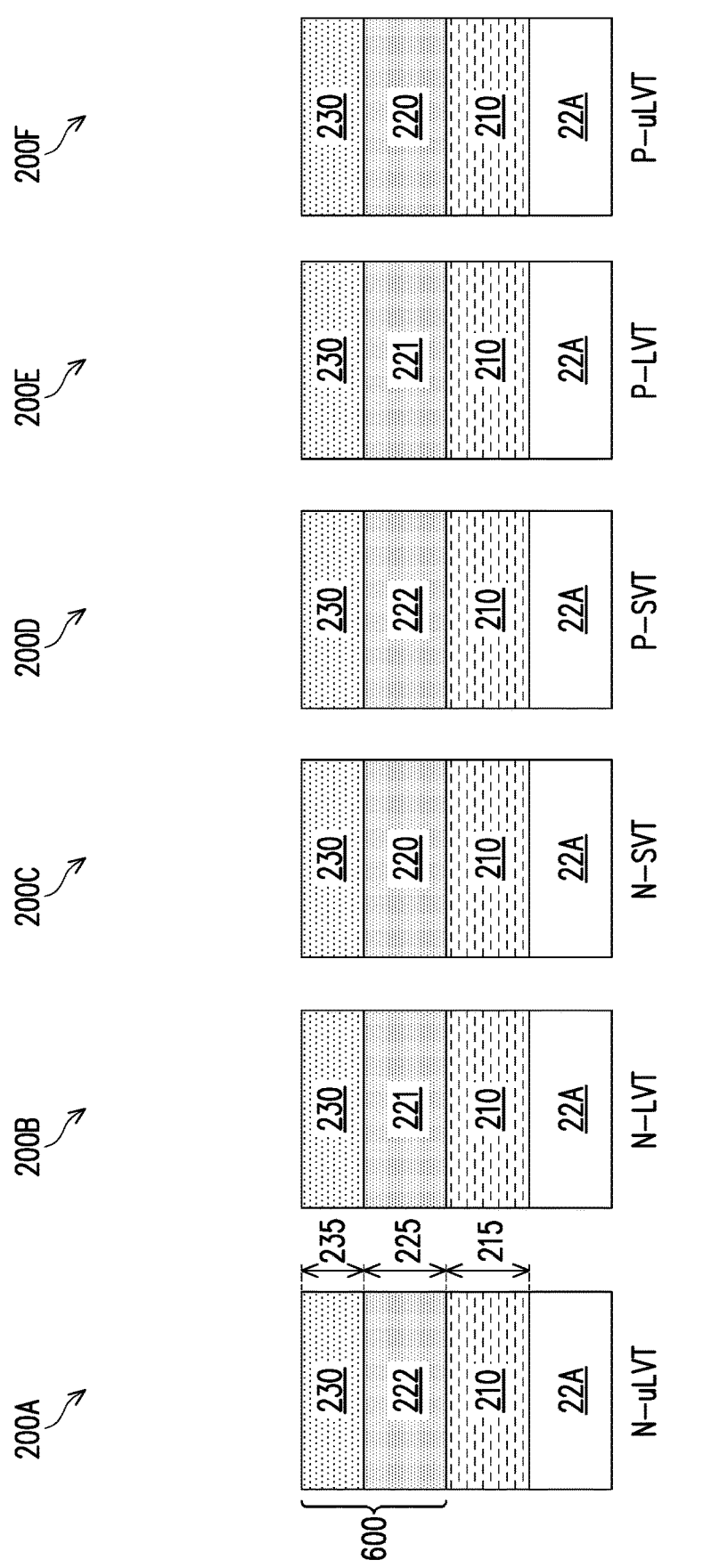

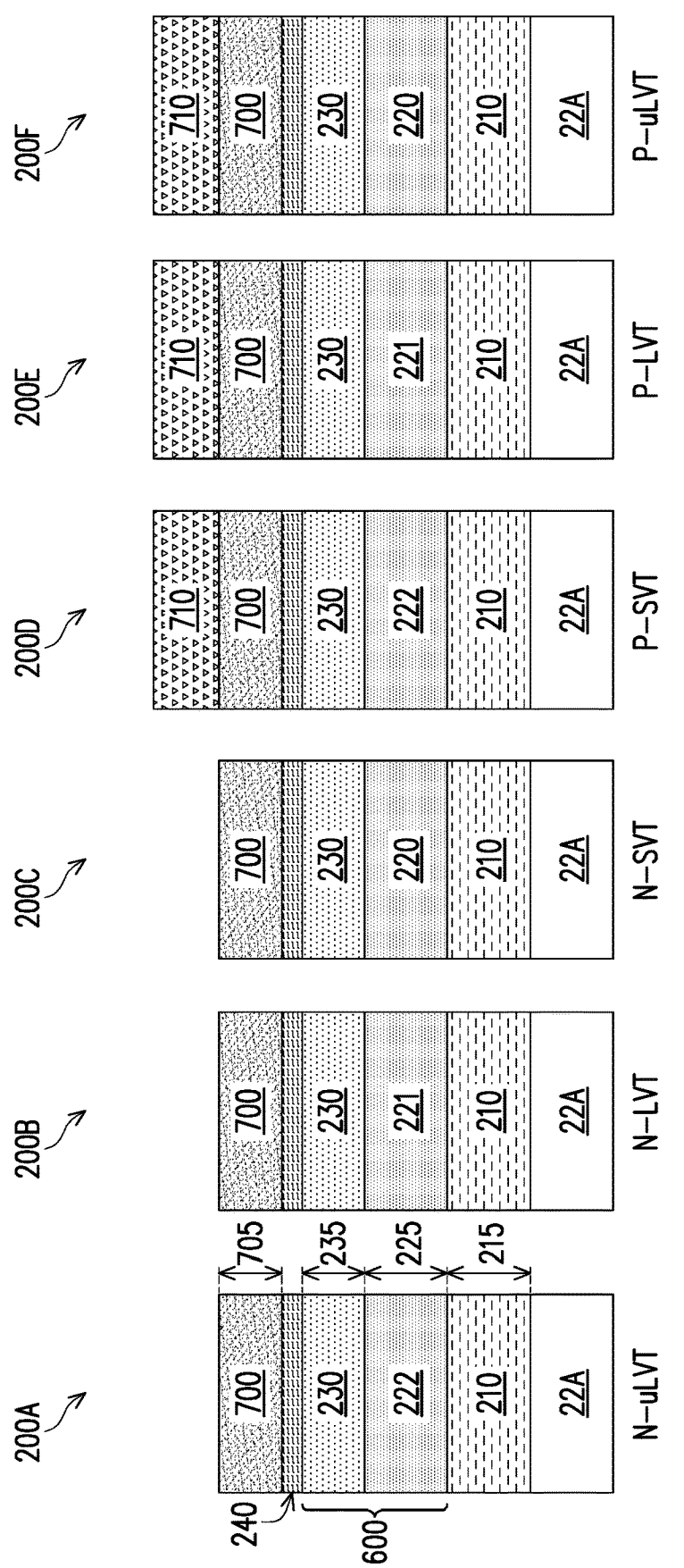

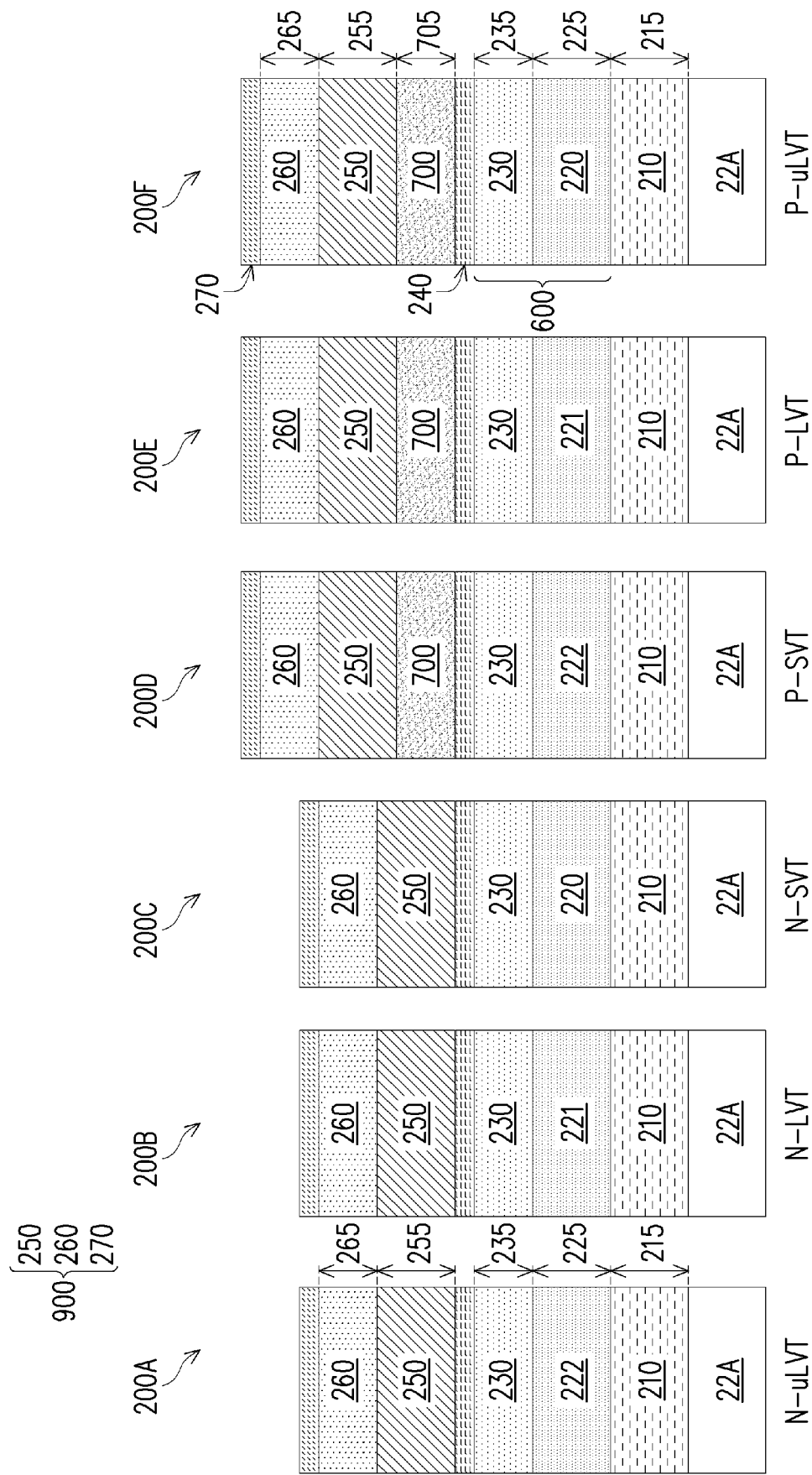

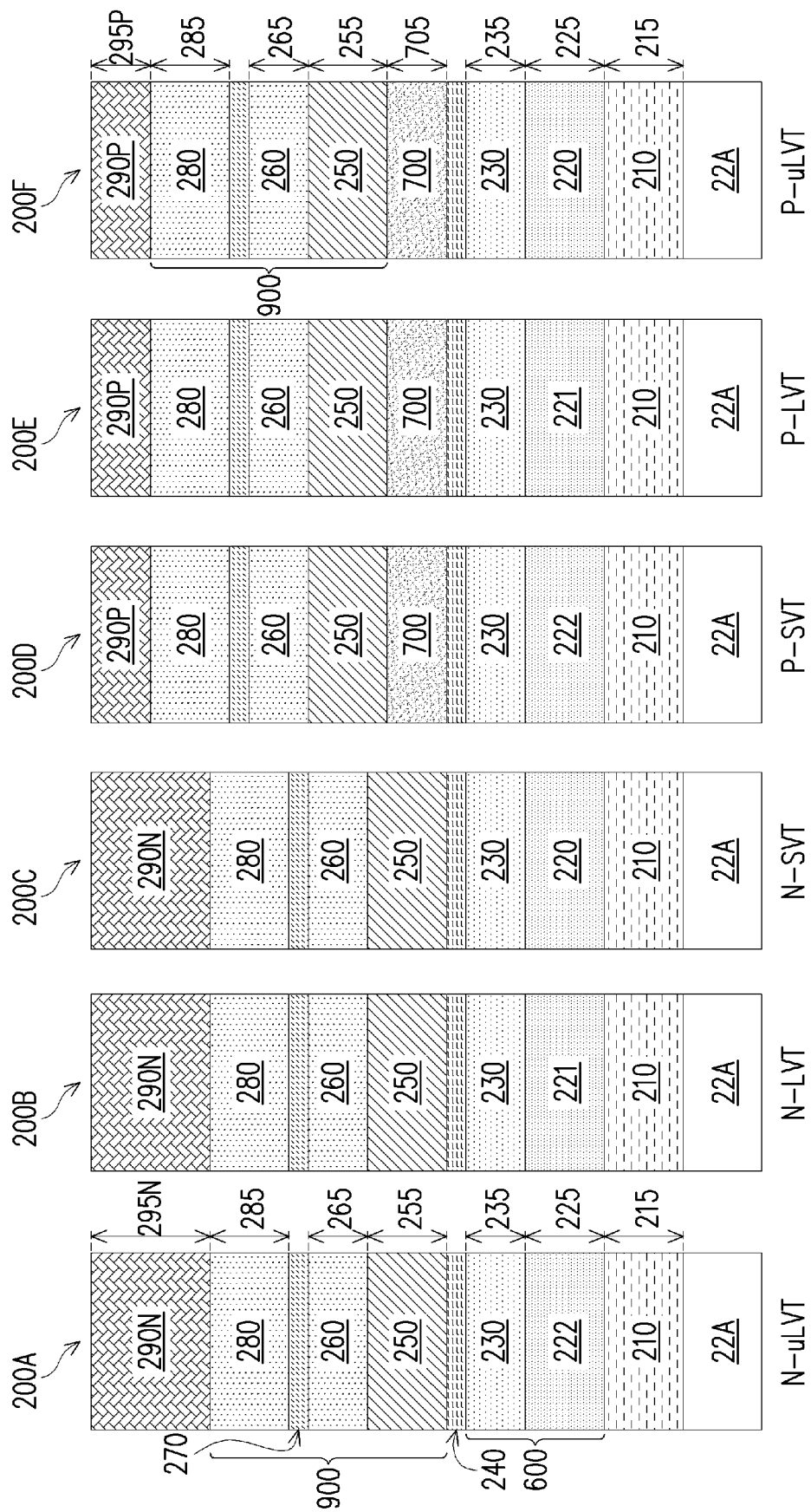

GATE STRUCTURE AND METHOD

PRIORITY CLAIM AND CROSS-REFERENCE

This application claims the benefit of priority to U.S. Provisional Application Ser. No. 63/035,408, entitled "NOVEL GATE STACK STRUCTURE AND FORMING METHOD THEREOF," filed on Jun. 5, 2020, which application is incorporated by reference herein in its entirety.

BACKGROUND

The semiconductor integrated circuit (IC) industry has experienced exponential growth. Technological advances in IC materials and design have produced generations of ICs where each generation has smaller and more complex circuits than the previous generation. In the course of IC evolution, functional density (i.e., the number of interconnected devices per chip area) has generally increased while geometry size (i.e., the smallest component (or line) that can be created using a fabrication process) has decreased. This scaling down process generally provides benefits by increasing production efficiency and lowering associated costs. Such scaling down has also increased the complexity of processing and manufacturing ICs.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIGS. 2A-10C are views of various embodiments of an IC device of at various stages of fabrication according to various aspects of the present disclosure.

FIGS. 12A-19F are views of various embodiments of an IC device of at various stages of fabrication according to various aspects of the present disclosure.

DETAILED DESCRIPTION

Figure 1:
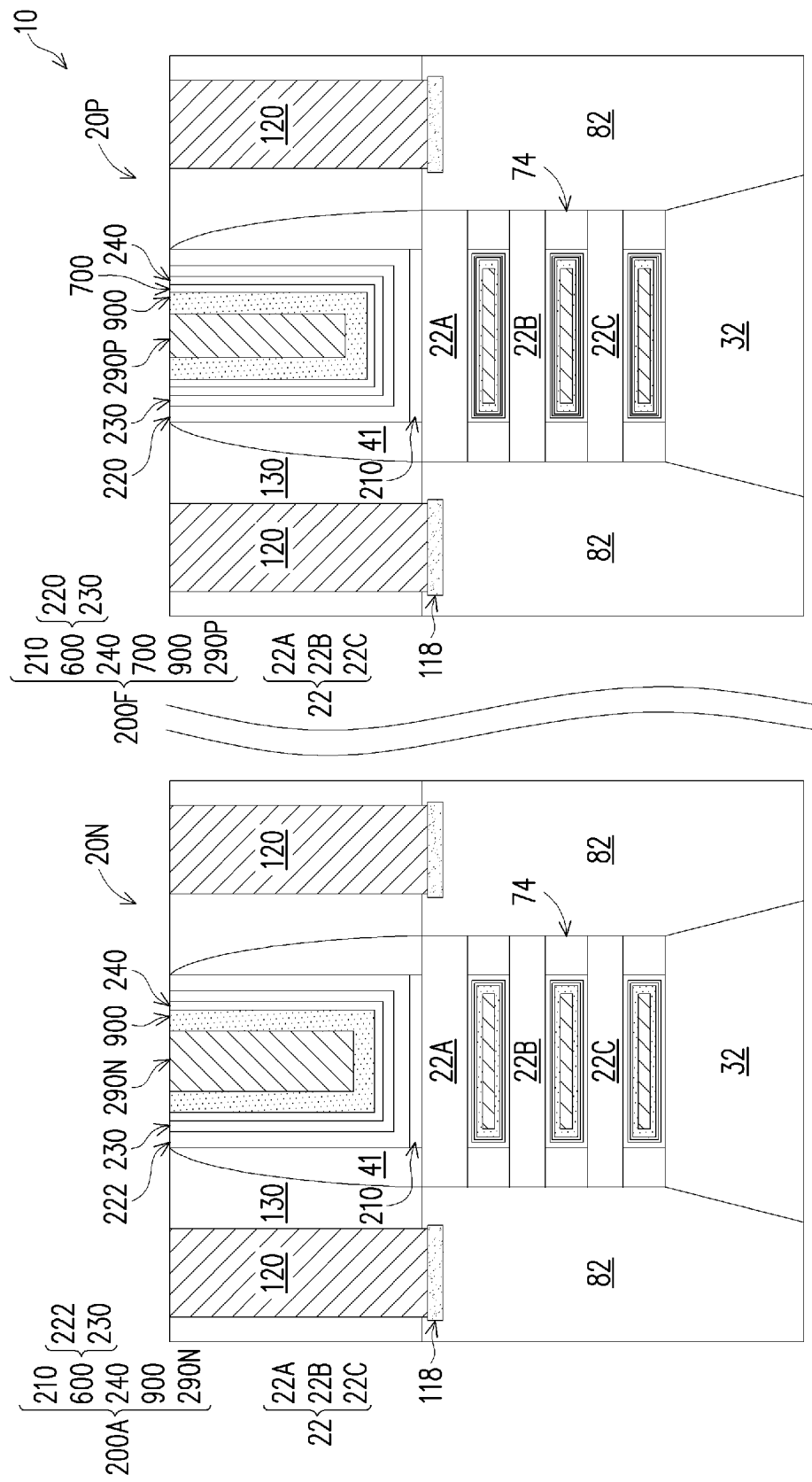
FIG. 1 is a diagrammatic cross-sectional side view of a portion of an IC device fabricated according to embodiments of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

The present disclosure is generally related to semiconductor devices, and more particularly to field-effect transistors (FETs), such as planar FETs, three-dimensional fin-line FETs (FinFETs), or gate-all-around (GAA) devices. Different threshold voltages ("Vt") of the semiconductor devices are desirable to optimize performance of circuit elements having widely different functional requirements. Threshold voltage in conventional devices may be tuned by increasing the thicknesses of different work function metals of a gate electrode. However, as the device scaling down process continues, increasing the thicknesses of different work function metals may become unfeasible and/or may lead to various manufacturing difficulties. In advanced technology nodes, gate fill window for multiple Vt tuning by varying thickness of work function metal film with photolithographic patterning becomes difficult due to gate length dimension shrinkage. Such gate fill window challenges can lead to high gate resistance, which is undesirable.

Gate stack structures disclosed herein improve gate fill window, and achieve lower gate resistance, for multiple Vt tuning with photolithographic patterning. Multiple Vt tuning is achieved by selectively driving in specific metal or boron ions to a first high-k dielectric layer of a gate structure at various concentrations effective to tune the various threshold voltages. A second high-k dielectric layer deposition on the first high-k dielectric layer may be included to reduce gate leakage. Work function barrier layers of different thicknesses may also be included after Al-controlled ALE removal of a high-k capping layer to tune the threshold voltages. These techniques improve the flexibility in tuning the threshold voltage compared to conventional devices, as discussed below in more detail.

FIG. 1 illustrates a diagrammatic cross-sectional side view of a portion of an IC device 10 fabricated according to embodiments of the present disclosure, where the IC device 10 includes gate-all-around (GAA) devices 20N, 20P. The GAA devices 20N, 20P may include at least an NFET or a PFET in some embodiments. For example, the GAA device 20N is an NFET, and the GAA device 20P is a PFET, in accordance with some embodiments. Integrated circuit devices such as the IC device 10 frequently include transistors having different threshold voltages based on their function in the IC device. For example, input/output (TO) transistors typically have the highest threshold voltages due to the high current handling required of the IO transistors. Core logic transistors typically have the lowest threshold voltages to achieve higher switching speeds at lower operating power. A third threshold voltage between that of the IO transistors and that of the core logic transistors may also be employed for certain other functional transistors, such as static random access memory (SRAM) transistors. Some circuit blocks within the IC device 10 may include two or more NFETs and/or PFETs of two or more different threshold voltages.

The cross-sectional view of the IC device 10 in FIG. 1 is taken along an X-Z plane, where the X-direction is the horizontal direction, and the Z-direction is the vertical direction. The GAA devices 20N, 20P each include channels 22A-22C (alternately referred to as "nanostructures") over a fin structure 32. The channels 22A-22C are laterally abutted by source/drain features 82, and covered and surrounded by gate structures 200A, 200F. The gate structures 200A, 200F control flow of electrical current through the channels 22A-22C based on voltages applied at the gate structures 200A, 200F and at the source/drain features 82. The threshold voltage is a minimum voltage (e.g., gate-source voltage or source-gate voltage) needed to establish a conducting path in the channels 22A-22C. Threshold voltage tuning during fabrication of the various transistors, e.g., IO transistors, core logic transistors, and SRAM transistors, preferably with low modification of the fabrication process, is accomplished by at least one of the techniques applied during fabrication of the gate structures 200A, 200F, described in greater detail below.

In some embodiments, the fin structure 32 includes silicon. In some embodiments, the GAA device 20N is an NFET, and the source/drain features 82 thereof include silicon phosphorous (SiP). In some embodiments, the GAA device 20P is a PFET, and the source/drain features 82 thereof include silicon germanium (SiGe).

The channels 22A-22C each include a semiconductive material, for example silicon or a silicon compound, such as silicon germanium, or the like. The channels 22A-22C are nanostructures (e.g., having sizes that are in a range of a few nanometers) and may also each have an elongated shape and extend in the X-direction. In some embodiments, the channels 22A-22C each have a nano-wire (NW) shape, a nano-sheet (NS) shape, a nano-tube (NT) shape, or other suitable nanoscale shape. The cross-sectional profile of the channels 22A-22C may be rectangular, round, square, circular, elliptical, hexagonal, or combinations thereof.

In some embodiments, the lengths (e.g., measured in the X-direction) of the channels 22A-22C may be different from each other, for example due to tapering during a fin etching process. In some embodiments, length of the channel 22A may be less than a length of the channel 22B, which may be less than a length of the channel 22C. The channels 22A-22C each may not have uniform thickness, for example due to a channel trimming process used to expand spacing (e.g., measured in the Z-direction) between the channels 22A-22C to increase gate structure fabrication process window. For example, a middle portion of each of the channels 22A-22C may be thinner than the two ends of each of the channels 22A-22C. Such shape may be collectively referred to as a "dog-bone" shape.

In some embodiments, the spacing between the channels 22A-22C (e.g., between the channel 22B and the channel 22A or the channel 22C) is in a range between about 8 nanometers (nm) and about 12 nm. In some embodiments, a thickness (e.g., measured in the Z-direction) of each of the channels 22A-22C is in a range between about 5 nm and about 8 nm. In some embodiments, a width (e.g., measured in the Y-direction, not shown in FIG. 1, orthogonal to the X-Z plane) of each of the channels 22A-22C is at least about 8 nm.

The gate structures 200A, 200F, are disposed over and between the channels 22A-22C, respectively. In some embodiments, the gate structure 200A is disposed over and between the channels 22A-22C, which are silicon channels for N-type devices, and the gate structure 200F is disposed over and between, for example, silicon germanium channels for P-type devices. In some embodiments, threshold voltage tuning is achieved by driving at least one specific dopant into first high-k gate dielectric layers 222, 220 of the gate structures 200A, 200F, respectively. In some embodiments, threshold voltage tuning is alternately or further achieved by adding one or more barrier layers 700 (also referred to as "work function barrier layers") in a work function metal layer between a second high-k gate dielectric layer 230 and a metal fill layer 290P. While three threshold voltages are described in FIG. 12A to FIG. 19F for each of N-type and P-type transistor devices, the techniques described can be used to fabricate IC devices including two different threshold voltages or more than three threshold voltages while maintaining a large gate fill window.

A first interfacial layer (IL) 210, which may be an oxide of the material of the channels 22A-22C, is formed on exposed areas of the channels 22A-22C and the top surface of the fin 32. The first IL layer 210 promotes adhesion of the first gate dielectric layers 222, 220 to the channels 22A-22C. In some embodiments, the first IL layer 210 has thickness of about 5 Angstroms (A) to about 50 Angstroms (A). In some embodiments, the first IL layer 210 has thickness of about 10 A. The first IL layer 210 having thickness that is too thin may exhibit voids or insufficient adhesion properties. The first IL layer 210 being too thick consumes gate fill window, which is related to threshold voltage tuning and resistance as described above.

The first gate dielectric layers 222, 220 and the second gate dielectric layer 230 are collectively referred to as "the gate dielectric layers" or gate dielectric structure 600. In some embodiments, the gate dielectric layers 222, 220, 230 include a high-k gate dielectric material, which may refer to dielectric materials having a high dielectric constant that is greater than a dielectric constant of silicon oxide (k≈3.9). Exemplary high-k dielectric materials include $HfO_2$, HfSiO, HfSiON, HfTaO, HfSiO, HfZrO, $ZrO_2$, $Ta_2O_5$, or combinations thereof. In some embodiments, the first gate dielectric layer 222 has thickness of about 5 A to about 50 A, which may be similar to, or somewhat thinner than, the first IL layer 210. In some embodiments, the first gate dielectric layers 222, 220 each have thickness of about 9 A. In some embodiments, the second gate dielectric layer 230 has thickness of about 5 A to about 50 A, and is substantially thinner than the first gate dielectric layers 222, 220. In some embodiments, the second gate dielectric layer 230 has thickness of about 6 A, which is about two-thirds that of the first gate dielectric layers 222, 220.

In some embodiments, the first gate dielectric layer 222 may further include dopants, such as metal ions driven into the high-k gate dielectric from $La_2O_3$, MgO, $Y_2O_3$, $TiO_2$, $Al_2O_3$, $Nb_2O_5$, or the like, or boron ions driven in from $B_2O_3$, at a concentration to achieve threshold voltage tuning, while the first gate dielectric layer 220 is substantially devoid of the dopants. As one example, for N-type transistor devices, lanthanum ions in higher concentration reduce the threshold voltage relative to layers with lower concentration or devoid of lanthanum ions, while the reverse is true for P-type devices. In some embodiments, the first gate dielectric layer 222 of certain transistor devices (e.g., IO transistors) is also devoid of the dopant that is present in certain other transistor devices (e.g., N-type core logic transistors or P-type IO transistors). In N-type IO transistors, for example, relatively high threshold voltage is desirable, such that it may be preferable for the IO transistor high-k dielectric layers to be free of lanthanum ions, which would otherwise reduce the threshold voltage. The second gate dielectric layer 230 is substantially devoid of the dopant present in the first gate dielectric layer 222. The second gate dielectric layer 230 reduces gate leakage.

The gate structures 200A, 200F further include one or more work function metal layers, represented collectively as the first work function metal layer 900. In the GAA device 20N, which is an NFET in most embodiments, the first work function metal layer 900 may include at least an N-type work function metal layer, an in-situ capping layer, and an oxygen blocking layer. In some embodiments, the first work function metal layer 900 includes more or fewer layers than those described. In the GAA device 20P, which is a PFET in most embodiments, the first work function metal layer 900 is substantially the same as in the GAA device 20N, and the gate structure 200F may further include an additional second work function layer 700, which generally includes one or more barrier layers comprising a metal nitride, such as TiN, WN, MoN, TaN, or the like. Each of the one or more barrier layers may have thickness ranging from about 5 A to about 20 A. Inclusion of the one or more barrier layers provides additional threshold voltage tuning flexibility. In general, each additional barrier layer increases the threshold voltage. As such, for an NFET, a higher threshold voltage device (e.g., an IO transistor device) may have at least one or more than two additional barrier layers, whereas a lower threshold voltage device (e.g., a core logic transistor device) may have few or no additional barrier layers. For a PFET, a higher threshold voltage device (e.g., an IO transistor device) may have few or no additional barrier layers, whereas a lower threshold voltage device (e.g., a core logic transistor device) may have at least one or more than two additional barrier layers. In the immediately preceding discussion, threshold voltage is described in terms of magnitude. As an example, an NFET IO transistor and a PFET IO transistor may have similar threshold voltage in terms of magnitude, but opposite polarity, such as +1 Volt for the NFET IO transistor and −1 Volt for the PFET IO transistor. As such, because each additional barrier layer increases threshold voltage in absolute terms (e.g., +0.1 Volts/layer), such an increase confers an increase to NFET transistor threshold voltage (magnitude) and a decrease to PFET transistor threshold voltage (magnitude).

The gate structures 200A, 200F also include metal fill layers 290N, 290P. The metal fill layers 290N, 290P may include a conductive material such as tungsten, cobalt, ruthenium, iridium, molybdenum, copper, aluminum, or combinations thereof. Between the channels 22A-22C, the metal fill layers 290N, 290P are circumferentially surrounded (in the cross-sectional view) by the one or more work function metal layers 900, and further by the work function barrier layers 700 in the gate structure 200F, which are then circumferentially surrounded by the gate dielectric layers 600. In the portion of the gate structures 200A, 200F formed over the channel 22A most distal from the fin 32, the metal fill layers 290N, 290P are formed over the one or more work function metal layers 900. The one or more work function metal layers 900 wrap around the metal fill layers 290N, 290P. The gate dielectric layers 600 also wrap around the one or more work function metal layers 900, and further wrap around the work function barrier layers 700 in the case of the gate structure 200F. The gate structures 200A, 200F may also include a glue layer that is formed between the one or more work function metal layers 900 and the metal fill layers 290N, 290P to increase adhesion. The glue layer is not specifically illustrated in FIG. 1 for simplicity, but is shown in FIGS. 19A-19F.

The GAA devices 20N, 20P also include gate spacers 41 and inner spacers 74 that are disposed on sidewalls of the first gate dielectric layers 222, 220. The inner spacers 74 are also disposed between the channels 22A-22C. The gate spacers 41 and the inner spacers 74 may include a dielectric material, for example a low-k material such as SiOCN, SiON, SiN, or SiOC.

The GAA devices 20N, 20P further include source/drain contacts 120 that are formed over the source/drain features 82. The source/drain contacts 120 may include a conductive material such as tungsten, cobalt, ruthenium, iridium, molybdenum, copper, aluminum, or combinations thereof. The source/drain contacts 120 may be surrounded by barrier layers (not shown), such as SiN or TiN, which help prevent or reduce diffusion of materials from and into the source/drain contacts 120. A silicide layer 118 may also be formed between the source/drain features 82 and the source/drain contacts 120, so as to reduce the source/drain contact resistance. The silicide layer 118 may contain a metal silicide material, such as cobalt silicide in some embodiments, or TiSi in some other embodiments.

The GAA devices 20N, 20P further include an interlayer dielectric (ILD) 130. The ILD 130 provides electrical isolation between the various components of the GAA devices 20N, 20P discussed above, for example between the gate structures 200A, 200F and the source/drain contacts 120.

Additional details pertaining to the fabrication of GAA devices are disclosed in U.S. Pat. No. 10,164,012, titled "Semiconductor Device and Manufacturing Method Thereof" and issued on Dec. 25, 2018, as well as in U.S. Pat. No. 10,361,278, titled "Method of Manufacturing a Semiconductor Device and a Semiconductor Device" and issued on Jul. 23, 2019, the disclosures of each which are hereby incorporated by reference in their respective entireties.

Figure 10C:
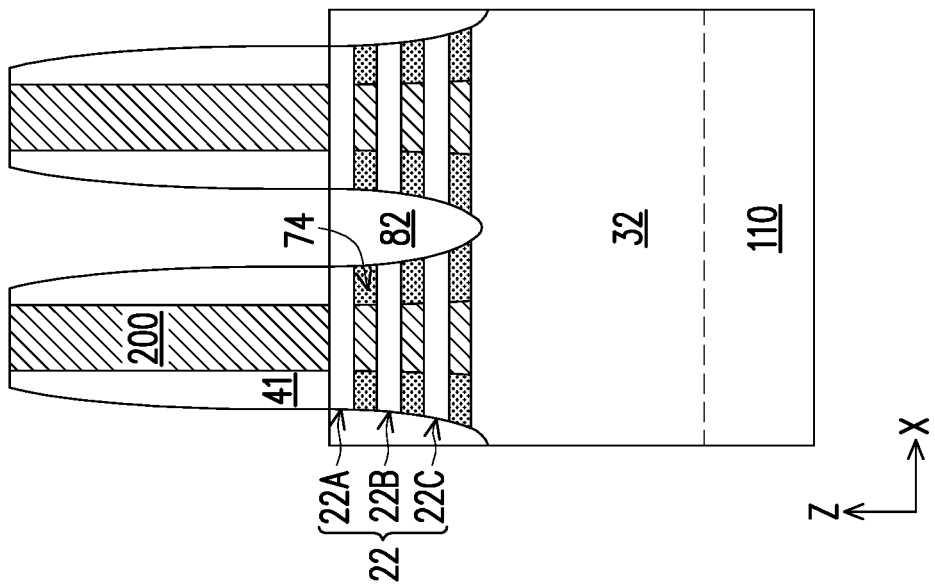
Figure 10B:
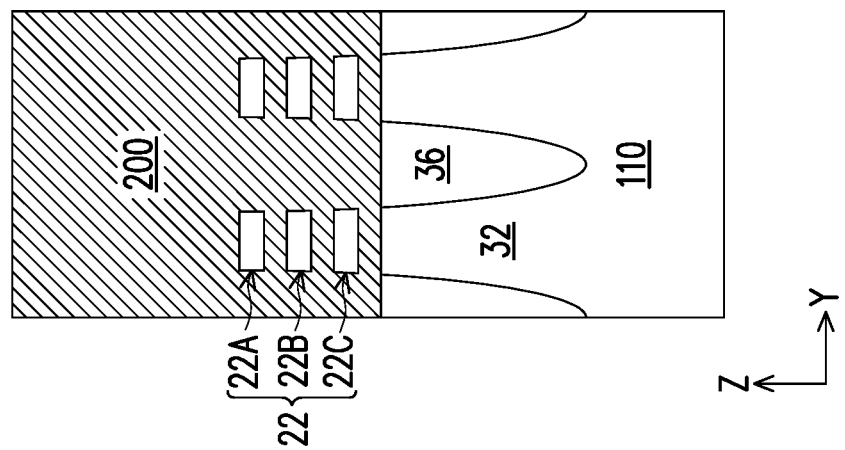
Figure 10A:
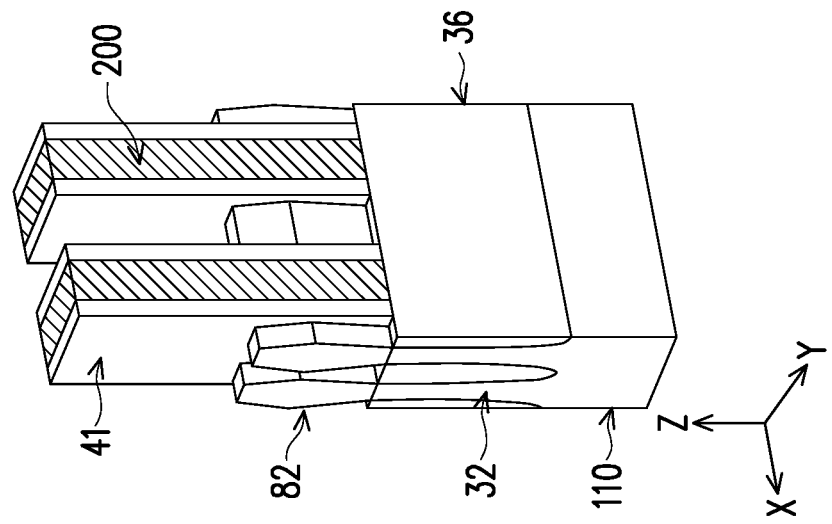
Figure 11:
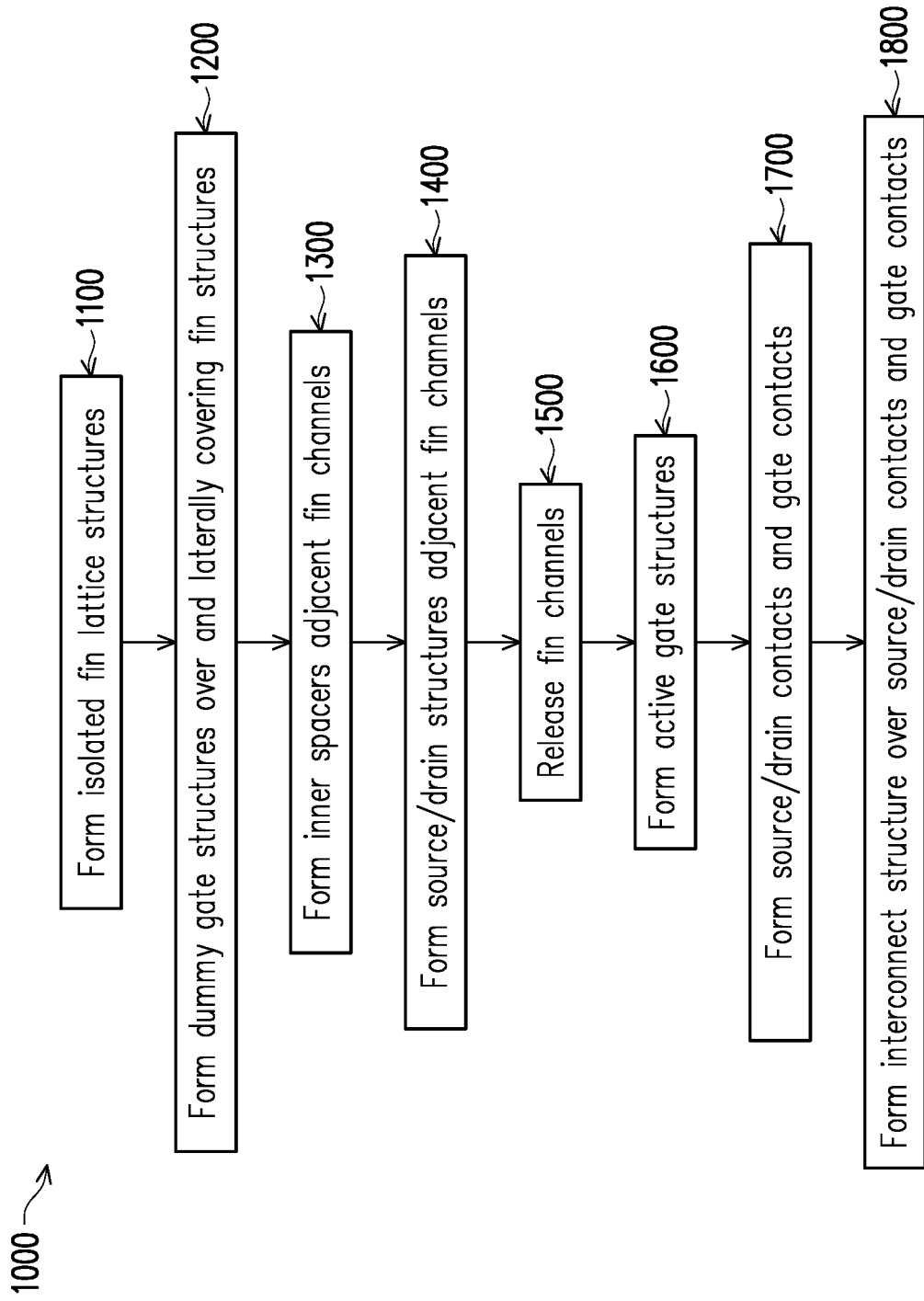
FIG. 11 is a flowchart illustrating a method of fabricating a semiconductor device according to various aspects of the present disclosure.
Figures 12A, 12B, 12C, 12D, 12E, 12F:
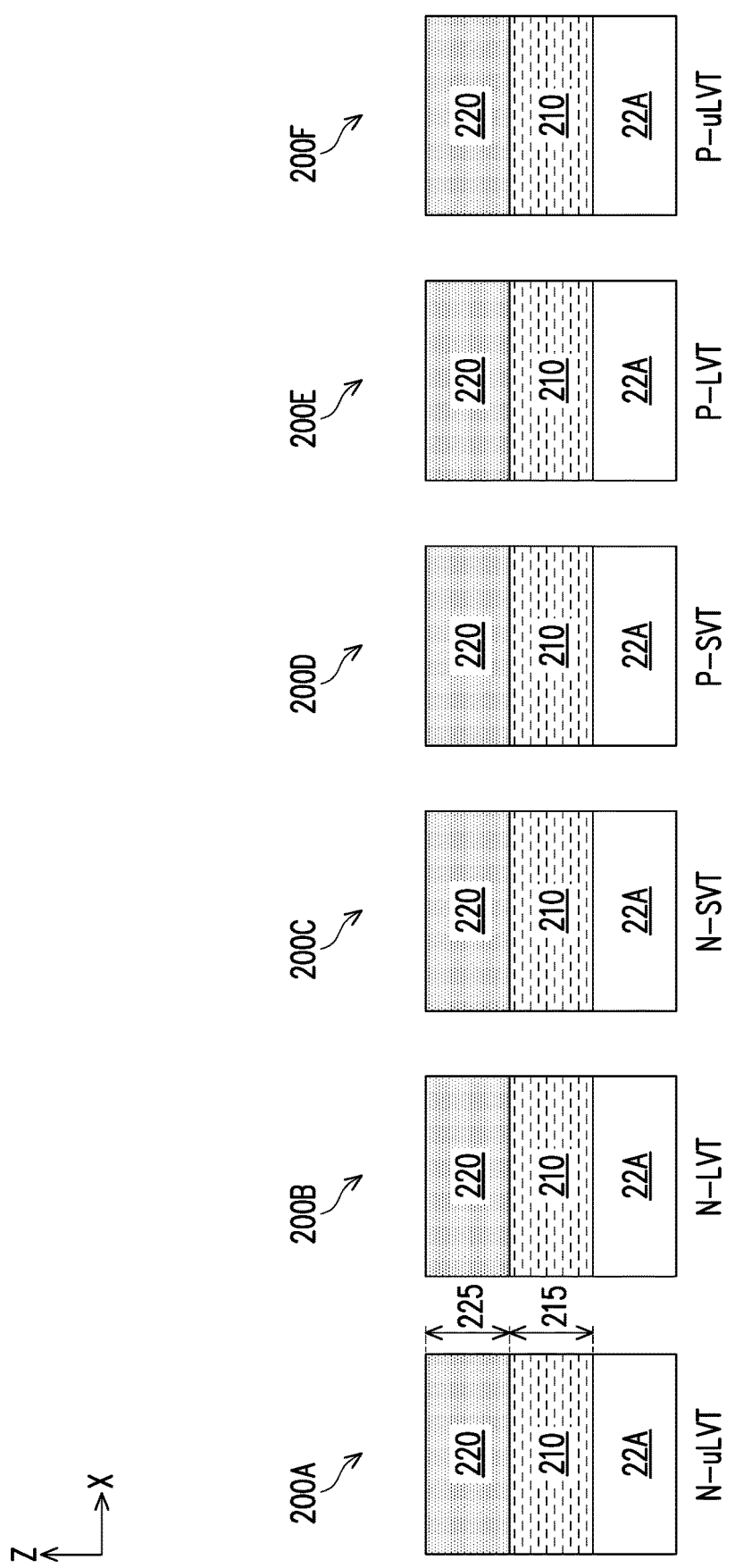

FIG. 11 illustrates a flowchart illustrating a method 1000 for forming an IC device or a portion thereof from a workpiece, according to one or more aspects of the present disclosure. Method 1000 is merely an example and is not intended to limit the present disclosure to what is explicitly illustrated in method 1000. Additional acts can be provided before, during and after the method 1000, and some acts described can be replaced, eliminated, or moved around for additional embodiments of the methods. Not all acts are described herein in detail for reasons of simplicity. Method 1000 is described below in conjunction with fragmentary cross-sectional views of a workpiece (shown in FIGS. 2A-2B, 3A-3B, 4A-4C, 5A-5C, 6A-6C, 7A-7C, 8A-8C, 9A-9C, and 10A-10C) at different stages of fabrication according to embodiments of method 1000. For avoidance of doubt, throughout the figures, the X direction is perpendicular to the Y direction and the Z direction is perpendicular to both the X direction and the Y direction. It is noted that, because the workpiece may be fabricated into a semiconductor device, the workpiece may be referred to as the semiconductor device as the context requires.

FIGS. 2A through 10C are perspective views and cross-sectional views of intermediate stages in the manufacturing of nano-FETs, in accordance with some embodiments. FIGS. 2A, 3A, 4A, 5A, 6A, 7A, 8A, 9A, and 10A illustrate perspective views. FIGS. 2B, 3B, 4B, 5B, 6B, 7B, 8B, 9B, and 10B illustrate reference cross-section B-B' (gate cut) illustrated in FIGS. 2A, 3A, and 4A. FIGS. 4C, 5C, 6C, 7C, 8C, 9C, and 10C illustrate reference cross-section C-C' (channel/fin cut) illustrated in FIG. 4A.

Figure 2B:
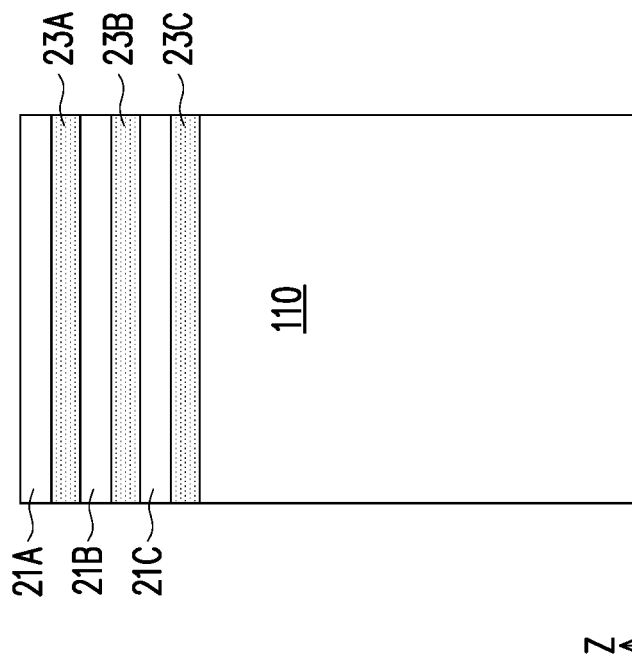
Figure 2A:
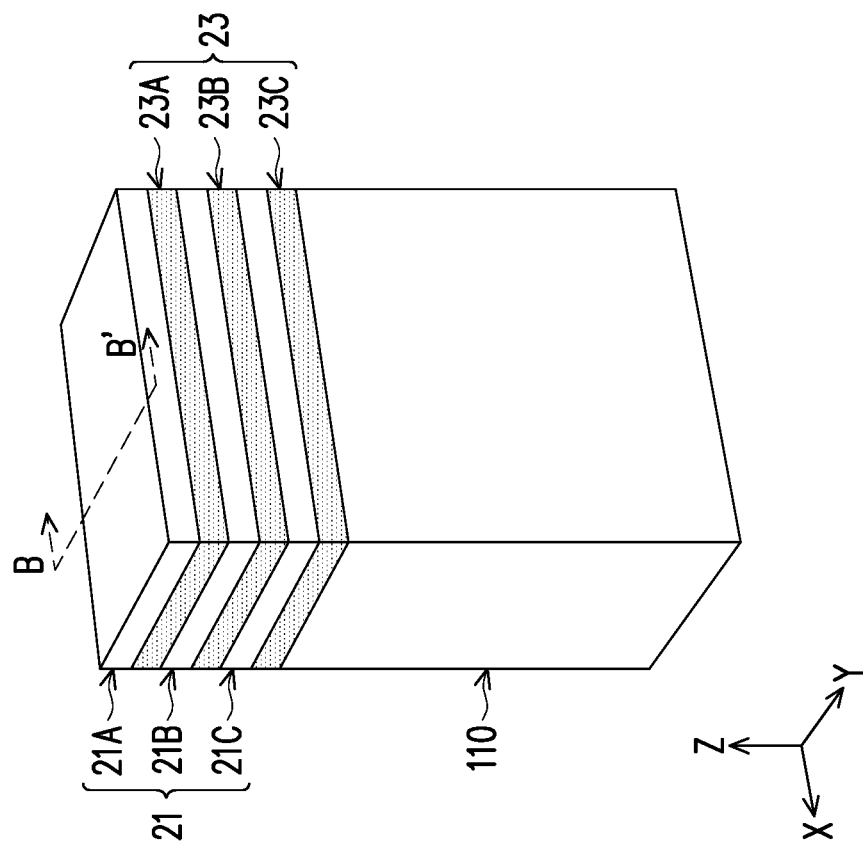

In FIG. 2A and FIG. 2B, a substrate 110 is provided. The substrate 110 may be a semiconductor substrate, such as a bulk semiconductor, or the like, which may be doped (e.g., with a p-type or an n-type dopant) or undoped. The semiconductor material of the substrate 110 may include silicon; germanium; a compound semiconductor including silicon carbide, gallium arsenide, gallium phosphide, indium phosphide, indium arsenide, and/or indium antimonide; an alloy semiconductor including silicon-germanium, gallium arsenide phosphide, aluminum indium arsenide, aluminum gallium arsenide, gallium indium arsenide, gallium indium phosphide, and/or gallium indium arsenide phosphide; or combinations thereof. Other substrates, such as single-layer, multi-layered, or gradient substrates may be used.

Further in FIG. 2A and FIG. 2B, a multi-layer stack 25 or "lattice" is formed over the substrate 110 of alternating layers of first semiconductor layers 21A-21C (collectively referred to as first semiconductor layers 21) and second semiconductor layers 23A-23C (collectively referred to as second semiconductor layers 23). In some embodiments, the first semiconductor layers 21 may be formed of a first semiconductor material suitable for n-type nano-FETs, such as silicon, silicon carbide, or the like, and the second semiconductor layers 23 may be formed of a second semiconductor material suitable for p-type nano-FETs, such as silicon germanium or the like. Each of the layers of the multi-layer stack 25 may be epitaxially grown using a process such as chemical vapor deposition (CVD), atomic layer deposition (ALD), vapor phase epitaxy (VPE), molecular beam epitaxy (MBE), or the like.

Three layers of each of the first semiconductor layers 21 and the second semiconductor layers 23 are illustrated. In some embodiments, the multi-layer stack 25 may include one or two each or four or more each of the first semiconductor layers 21 and the second semiconductor layers 23. Although the multi-layer stack 25 is illustrated as including a second semiconductor layer 23C as the bottommost layer, in some embodiments, the bottommost layer of the multi-layer stack 25 may be a first semiconductor layer 21.

Due to high etch selectivity between the first semiconductor materials and the second semiconductor materials, the second semiconductor layers 23 of the second semiconductor material may be removed without significantly removing the first semiconductor layers 21 of the first semiconductor material, thereby allowing the first semiconductor layers 21 to be patterned to form channel regions of nano-FETs. In some embodiments, the first semiconductor layers 21 are removed and the second semiconductor layers 23 are patterned to form channel regions. The high etch selectivity allows the first semiconductor layers 21 of the first semiconductor material to be removed without significantly removing the second semiconductor layers 23 of the second semiconductor material, thereby allowing the second semiconductor layers 23 to be patterned to form channel regions of nano-FETs.

Figure 3B:
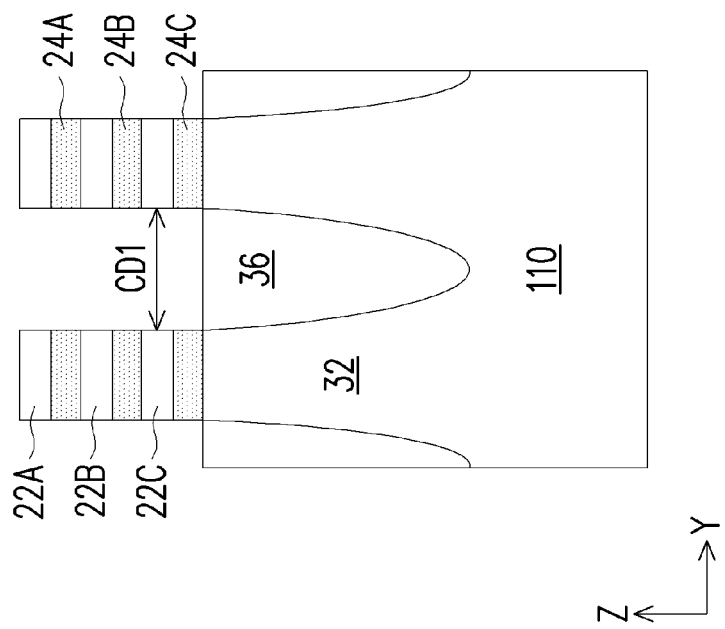
Figure 3A:
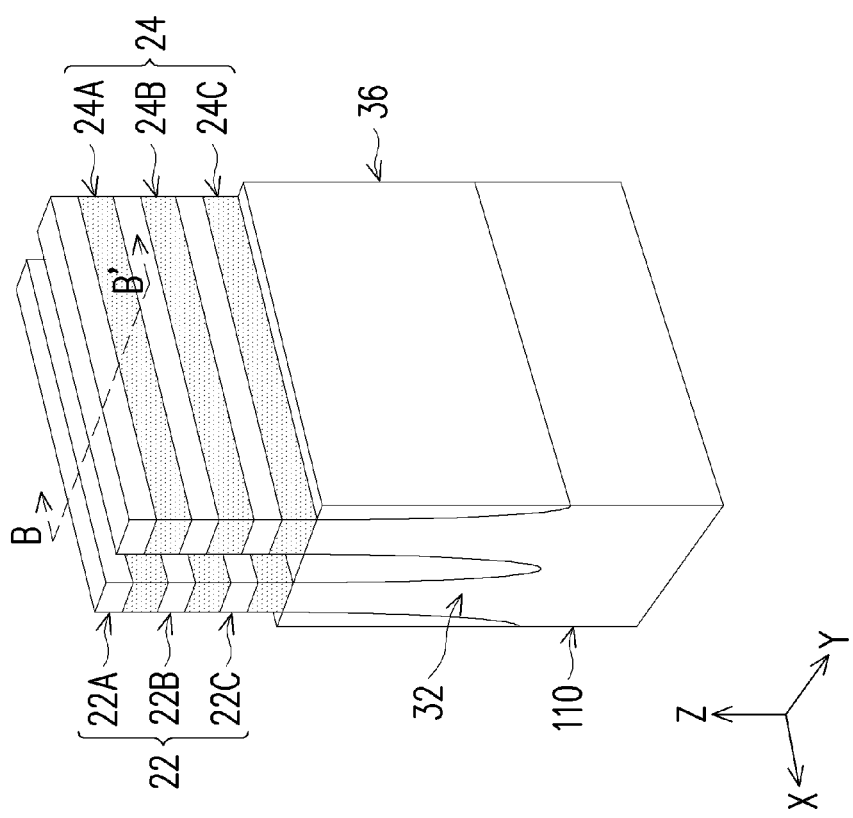

In FIG. 3A and FIG. 3B, fins 32 are formed in the substrate 110 and nanostructures 22, 24 are formed in the multi-layer stack 25 corresponding to act 1100 of FIG. 11. In some embodiments, the nanostructures 22, 24 and the fins 32 may be formed by etching trenches in the multi-layer stack 25 and the substrate 110. The etching may be any acceptable etch process, such as a reactive ion etch (RIE), neutral beam etch (NBE), the like, or a combination thereof. The etching may be anisotropic. First nanostructures 22A-22C (also referred to as "channels" below) are formed from the first semiconductor layers 21, and second nanostructures 24A-24C are formed from the second semiconductor layers 23. Distance CD1 between adjacent fins 32 and nanostructures 22, 24 may be from about 18 nm to about 100 nm.

The fins 32 and the nanostructures 22, 24 may be patterned by any suitable method. For example, one or more photolithography processes, including double-patterning or multi-patterning processes, may be used to form the fins 32 and the nanostructures 22, 24. Generally, double-patterning or multi-patterning processes combine photolithography and self-aligned processes, allowing for pitches smaller than what is otherwise obtainable using a single, direct photolithography process. As an example of one multi-patterning process, a sacrificial layer may be formed over a substrate and patterned using a photolithography process. Spacers are formed alongside the patterned sacrificial layer using a self-aligned process. The sacrificial layer is then removed, and the remaining spacers may then be used to pattern the fins 32.

FIGS. 3A and 3B illustrate the fins 32 having tapered sidewalls, such that a width of each of the fins 32 and/or the nanostructures 22, 24 continuously increases in a direction towards the substrate 110. In such embodiments, each of the nanostructures 22, 24 may have a different width and be trapezoidal in shape. In other embodiments, the sidewalls are substantially vertical (non-tapered), such that width of the fins 32 and the nanostructures 22, 24 is substantially similar, and each of the nanostructures 22, 24 is rectangular in shape.

In FIGS. 3A and 3B, isolation regions 36, which may be shallow trench isolation (STI) regions, are formed adjacent the fins 32. The isolation regions 36 may be formed by depositing an insulation material over the substrate 110, the fins 32, and nanostructures 22, 24, and between adjacent fins 32 and nanostructures 22, 24. The insulation material may be an oxide, such as silicon oxide, a nitride, the like, or a combination thereof, and may be formed by high-density plasma CVD (HDP-CVD), flowable CVD (FCVD), the like, or a combination thereof. In some embodiments, a liner (not separately illustrated) may first be formed along surfaces of the substrate 110, the fins 32, and the nanostructures 22, 24. Thereafter, a fill material, such as those discussed above may be formed over the liner.

The insulation material undergoes a removal process, such as a chemical mechanical polish (CMP), an etch-back process, combinations thereof, or the like, to remove excess insulation material over the nanostructures 22, 24. Top surfaces of the nanostructures 22, 24 may be exposed and level with the insulation material after the removal process is complete.

The insulation material is then recessed to form the isolation regions 36. After recessing, the nanostructures 22, 24 and upper portions of the fins 32 may protrude from between neighboring isolation regions 36. The isolation regions 36 may have top surfaces that are flat as illustrated, convex, concave, or a combination thereof. In some embodiments, the isolation regions 36 are recessed by an acceptable etching process, such as an oxide removal using, for example, dilute hydrofluoric acid (dHF), which is selective to the insulation material and leaves the fins 32 and the nanostructures 22, 24 substantially unaltered.

FIGS. 2A through 3B illustrate one embodiment (e.g., etch last) of forming the fins 32 and the nanostructures 22, 24. In some embodiments, the fins 32 and/or the nanostructures 22, 24 are epitaxially grown in trenches in a dielectric layer (e.g., etch first). The epitaxial structures may comprise the alternating semiconductor materials discussed above, such as the first semiconductor materials and the second semiconductor materials.

Further in FIG. 3A and FIG. 3B, appropriate wells (not separately illustrated) may be formed in the fins 32, the nanostructures 22, 24, and/or the isolation regions 36. Using masks, an n-type impurity implant may be performed in p-type regions of the substrate 110, and a p-type impurity implant may be performed in n-type regions of the substrate 110. Example n-type impurities may include phosphorus, arsenic, antimony, or the like. Example p-type impurities may include boron, boron fluoride, indium, or the like. An anneal may be performed after the implants to repair implant damage and to activate the p-type and/or n-type impurities. In some embodiments, in situ doping during epitaxial growth of the fins 32 and the nanostructures 22, 24 may obviate separate implantations, although in situ and implantation doping may be used together.

In FIGS. 4A-4C, dummy gate structures 40 are formed over the fins 32 and/or the nanostructures 22, 24, corresponding to act 1200 of FIG. 11. A dummy gate layer 45 is formed over the fins 32 and/or the nanostructures 22, 24. The dummy gate layer 45 may be made of materials that have a high etching selectivity versus the isolation regions 36. The dummy gate layer 45 may be a conductive, semiconductive, or non-conductive material and may be selected from a group including amorphous silicon, polycrystalline-silicon (polysilicon), poly-crystalline silicon-germanium (poly-SiGe), metallic nitrides, metallic silicides, metallic oxides, and metals. The dummy gate layer 45 may be deposited by physical vapor deposition (PVD), CVD, sputter deposition, or other techniques for depositing the selected material. A mask layer 47 is formed over the dummy gate layer 45, and may include, for example, silicon nitride, silicon oxynitride, or the like. In some embodiments, a gate dielectric layer (not illustrated for simplicity) is formed before the dummy gate layer 45 between the dummy gate layer 45 and the fins 32 and/or the nanostructures 22, 24.

A spacer layer 41 is formed over sidewalls of the mask layer 47 and the dummy gate layer 45. The spacer layer 41 is made of an insulating material, such as silicon nitride, silicon oxide, silicon carbo-nitride, silicon oxynitride, silicon oxy carbo-nitride, or the like, and may have a single-layer structure or a multi-layer structure including a plurality of dielectric layers, in accordance with some embodiments. The spacer layer 41 may be formed by depositing a spacer material layer (not shown) over the mask layer 47 and the dummy gate layer 45. Portions of the spacer material layer between dummy gate structures 40 are removed using an anisotropic etching process, in accordance with some embodiments.

Figure 5C:
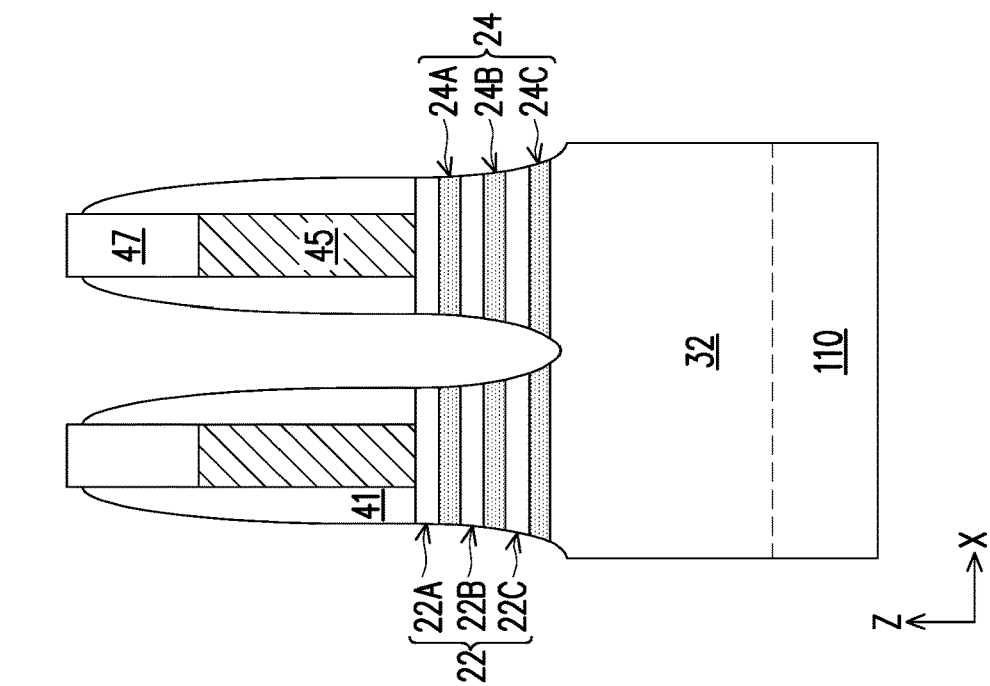
Figure 5B:
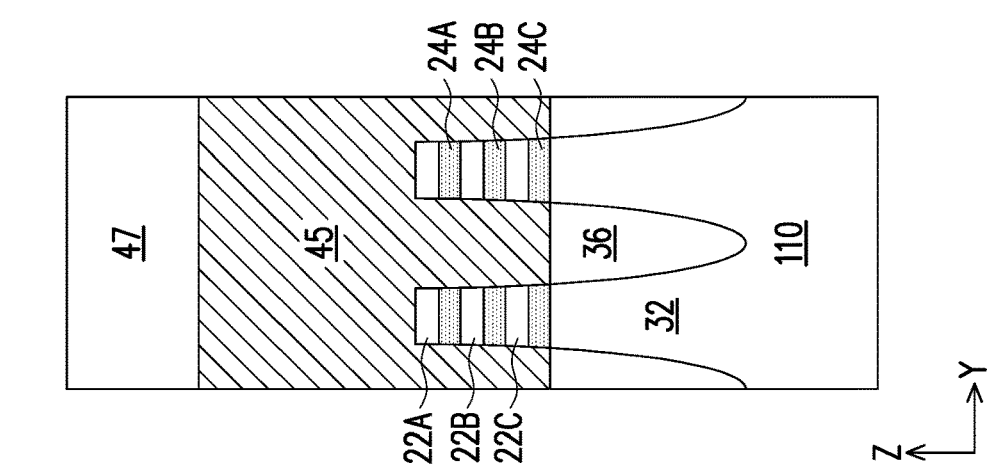
Figure 5A:
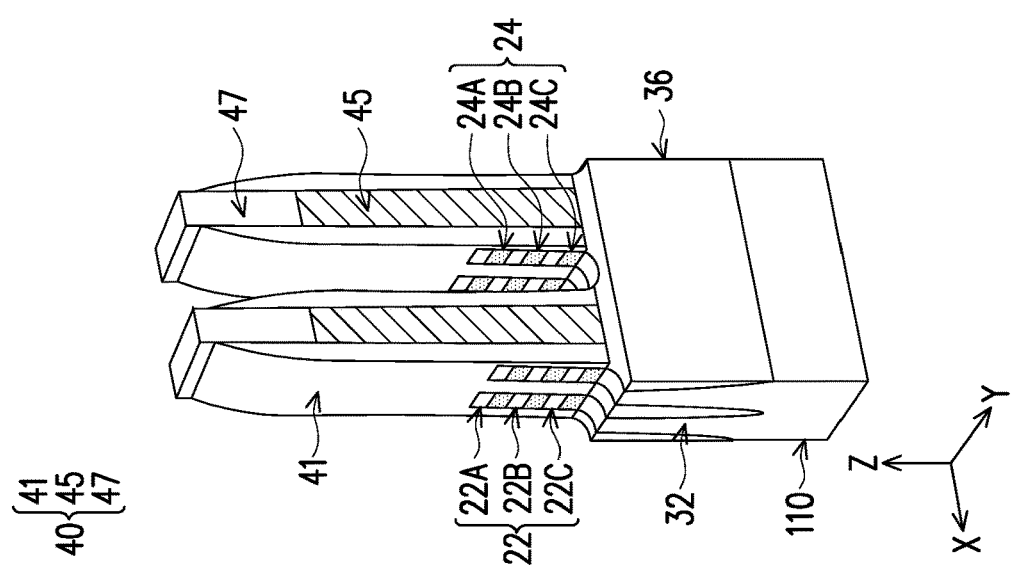

In FIGS. 5A-5C, an etching process is performed to etch the portions of protruding fins 32 and/or nanostructures 22, 24 that are not covered by dummy gate structures 40, resulting in the structure shown. The recessing may be anisotropic, such that the portions of fins 32 directly underlying dummy gate structures 40 and the spacer layer 41 are protected, and are not etched. The top surfaces of the recessed fins 32 may be substantially coplanar with the top surfaces of the isolation regions 36 as shown, in accordance with some embodiments. The top surfaces of the recessed fins 32 may be lower than the top surfaces of the isolation regions 36, in accordance with some other embodiments.

Figure 6C:
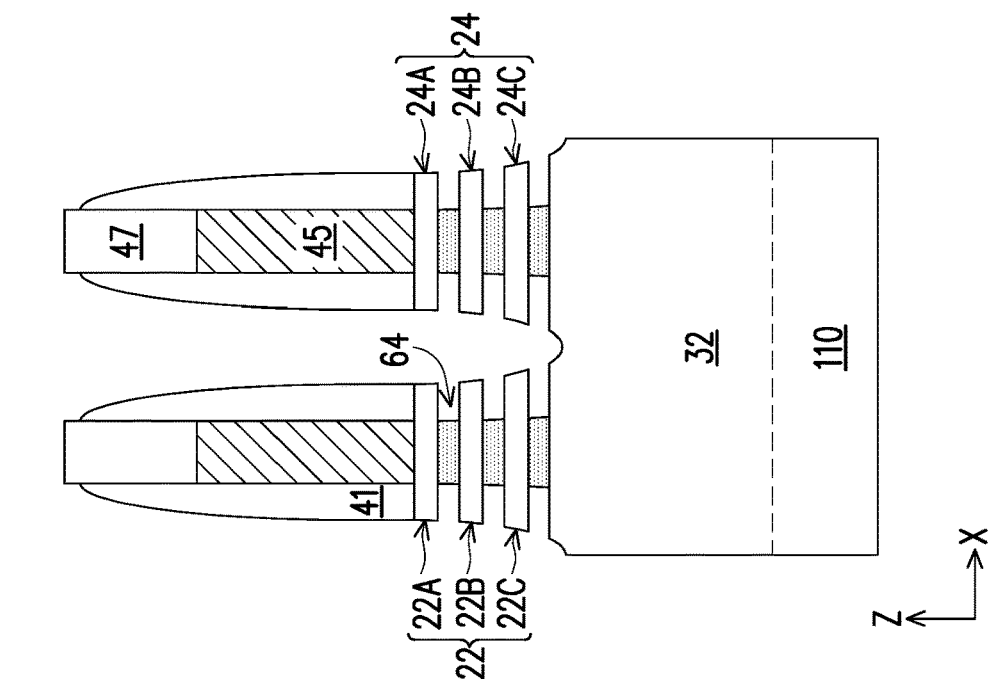
Figure 6B:
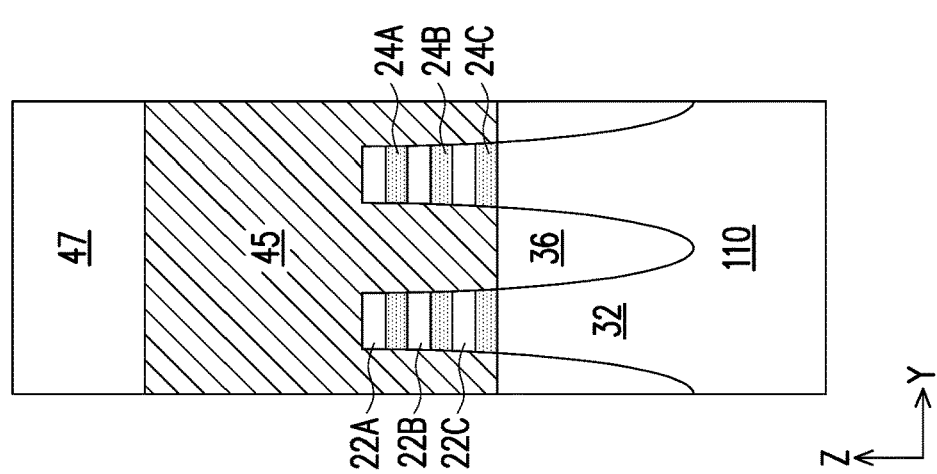
Figure 6A:
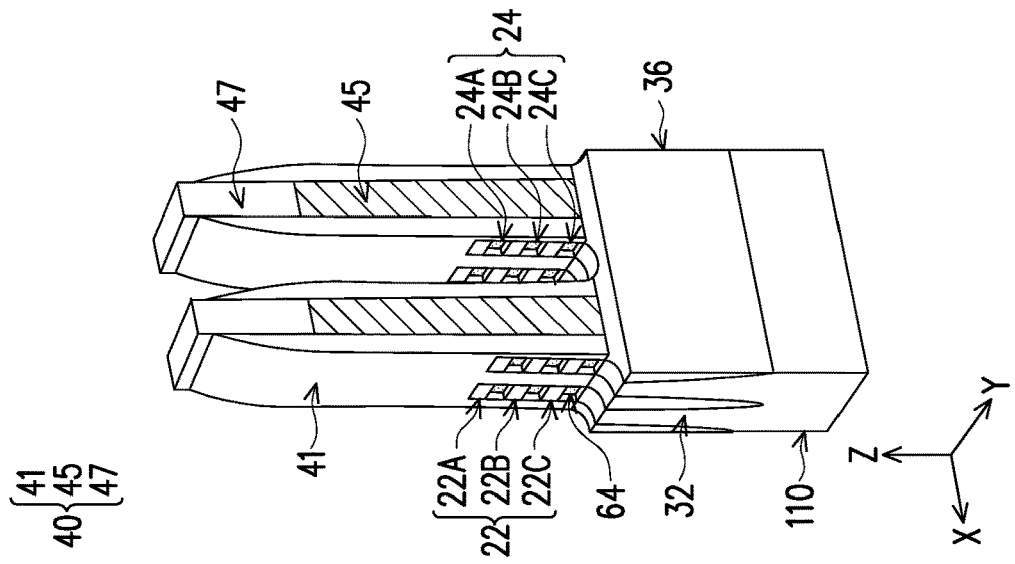

FIGS. 6A-6C and 7A-7C illustrate formation of inner spacers 74 corresponding to act 1300 of FIG. 11. A selective etching process is performed to recess end portions of the nanostructures 24 exposed by openings in the spacer layer 41 without substantially attacking the nanostructures 22. After the selective etching process, recesses 64 are formed in the nanostructures 24 at locations where the removed end portions used to be. The resulting structure is shown in FIGS. 6A-6C.

Figure 7C:
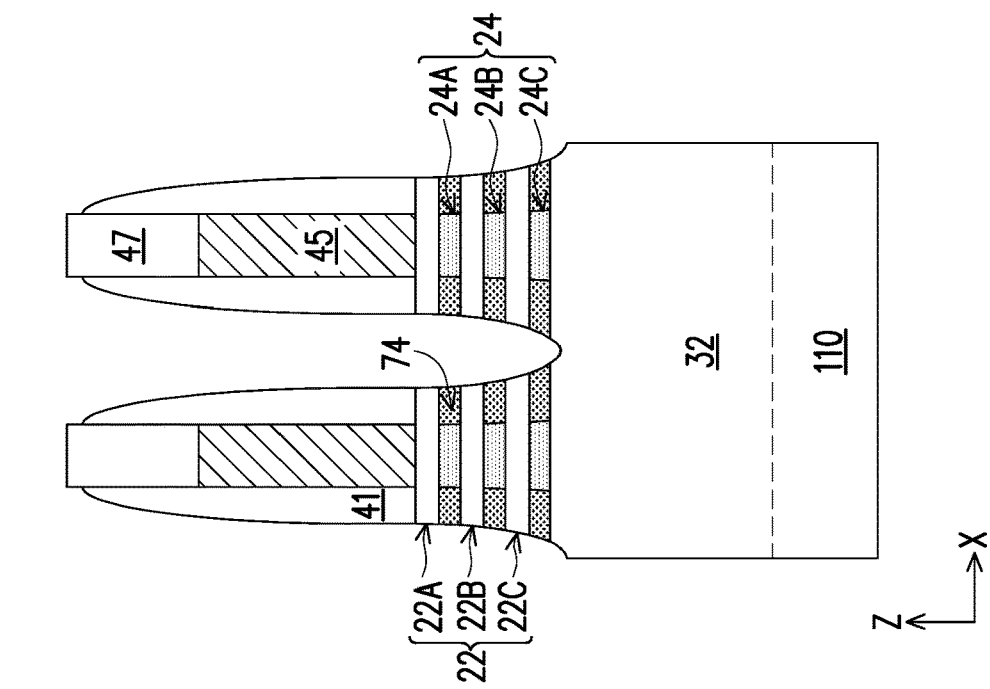
Figure 7B:
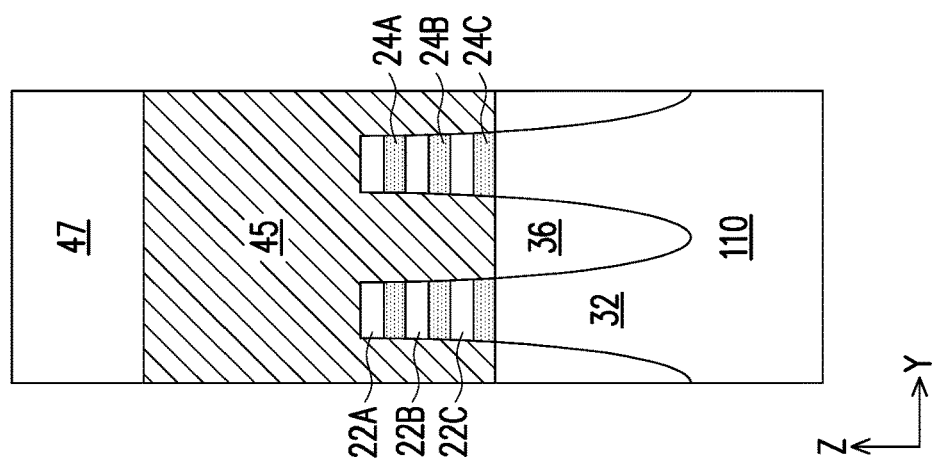
Figure 7A:
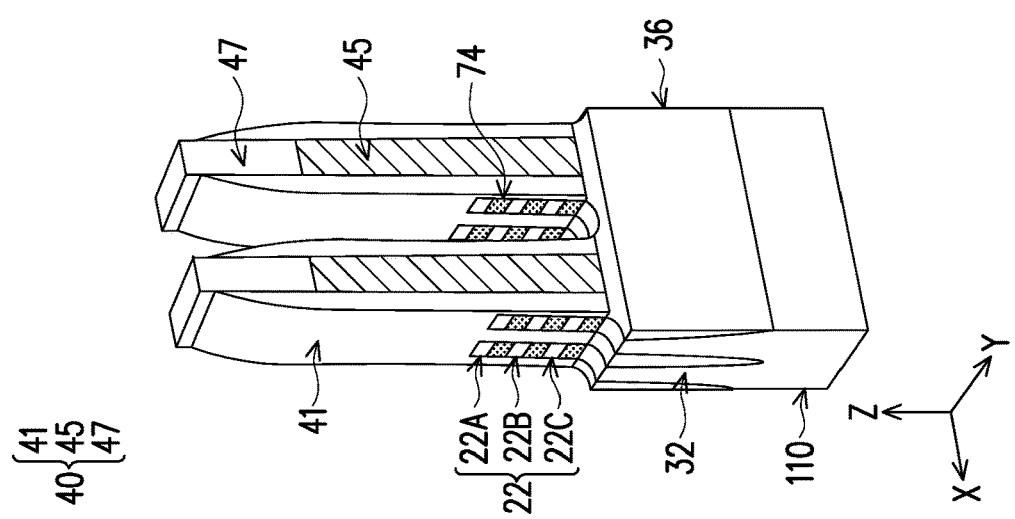

Next, an inner spacer layer is formed to fill the recesses 64 in the nanostructures 24 formed by the previous selective etching process. The inner spacer layer may be a suitable dielectric material, such as silicon carbon nitride (SiCN), silicon oxycarbonitride (SiOCN), or the like, formed by a suitable deposition method such as PVD, CVD, ALD, or the like. An etching process, such as an anisotropic etching process, is performed to remove portions of the inner spacer layers disposed outside the recesses in the nanostructures 24. The remaining portions of the inner spacer layers (e.g., portions disposed inside the recesses 64 in the nanostructures 24) form the inner spacers 74. The resulting structure is shown in FIGS. 7A-7C.

Figure 8C:
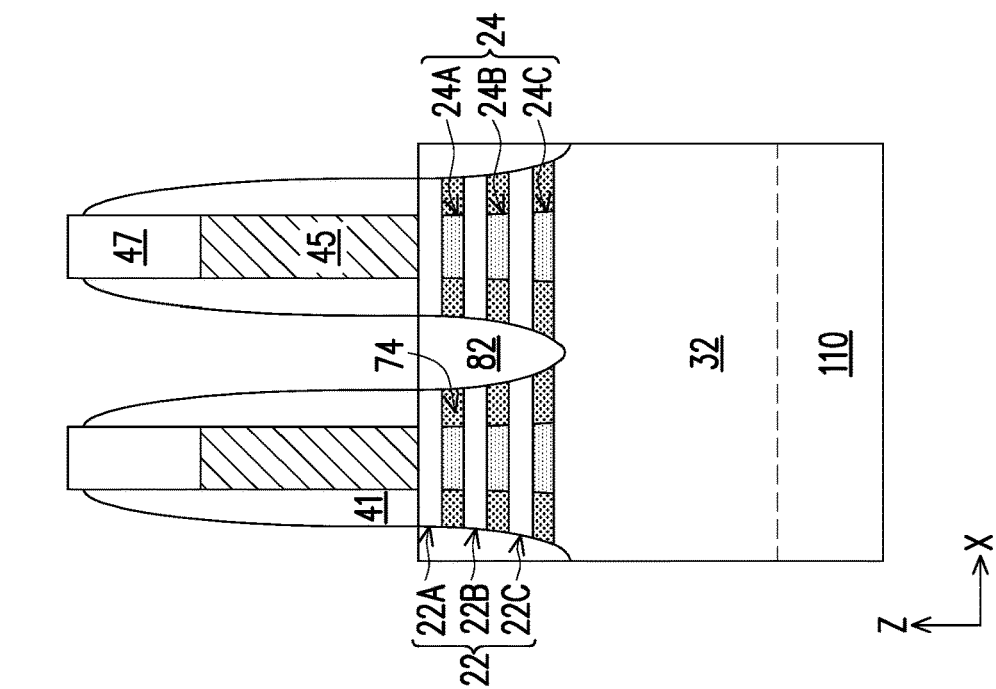
Figure 8B:
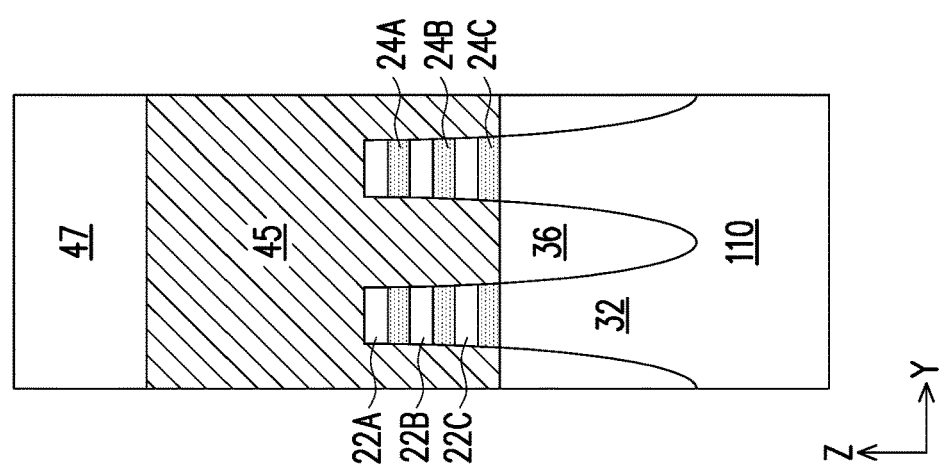
Figure 8A:
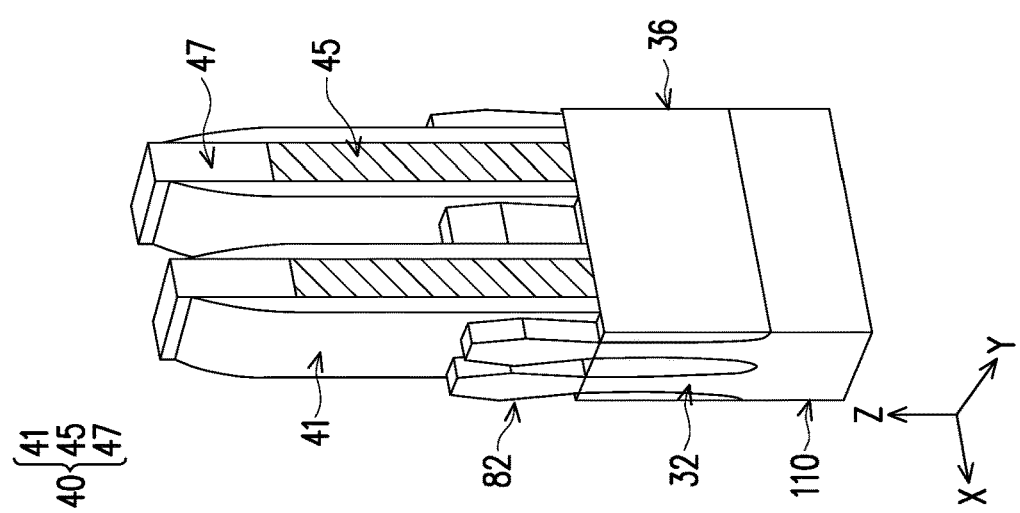

FIGS. 8A-8C illustrate formation of source/drain regions 82 corresponding to act 1400 of FIG. 11. In the illustrated embodiment, the source/drain regions 82 are epitaxially grown from epitaxial material(s). In some embodiments, the source/drain regions 82 exert stress in the respective channels 22A-22C, thereby improving performance. The source/drain regions 82 are formed such that each dummy gate structure 40 is disposed between respective neighboring pairs of the source/drain regions 82. In some embodiments, the spacer layer 41 separates the source/drain regions 82 from the dummy gate layer 45 by an appropriate lateral distance to prevent electrical bridging to subsequently formed gates of the resulting device.

The source/drain regions 82 may include any acceptable material, such as appropriate for n-type or p-type devices. For n-type devices, the source/drain regions 82 include materials exerting a tensile strain in the channel regions, such as silicon, SiC, SiCP, SiP, or the like, in some embodiments. When p-type devices are formed, the source/drain regions 82 include materials exerting a compressive strain in the channel regions, such as SiGe, SiGeB, Ge, GeSn, or the like, in accordance with certain embodiments. The source/drain regions 82 may have surfaces raised from respective surfaces of the fins and may have facets. Neighboring source/drain regions 82 may merge in some embodiments to form a singular source/drain region 82 adjacent two neighboring fins 32.

The source/drain regions 82 may be implanted with dopants followed by an anneal. The source/drain regions may have an impurity concentration of between about $10^{19}$ $cm^{-3}$ and about $10^{21}$ $cm^{-3}$. N-type and/or p-type impurities for source/drain regions 82 may be any of the impurities previously discussed. In some embodiments, the source/drain regions 82 are in situ doped during growth. A contact etch stop layer (CESL) and interlayer dielectric (ILD), not illustrated for simplicity, may then be formed covering the dummy gate structures 40 and the source/drain regions 82.

FIG. 9A, FIG. 9B, and FIG. 9C illustrate release of fin channels 22A-22C by removal of the nanostructures 24A-24C, the mask layer 47, and the dummy gate layer 45, which corresponds to act 1500 of FIG. 11. A planarization process, such as a CMP, is performed to level the top surfaces of the dummy gate layer 45 and gate spacer layer 41. The planarization process may also remove the mask layer 47 (see FIG. 8A) on the dummy gate layer 45, and portions of the gate spacer layer 41 along sidewalls of the mask layer 47. Accordingly, the top surfaces of the dummy gate layer 45 are exposed.

Next, the dummy gate layer 45 is removed in an etching process, so that recesses 92 are formed. In some embodiments, the dummy gate layer 45 is removed by an anisotropic dry etch process. For example, the etching process may include a dry etch process using reaction gas(es) that selectively etch the dummy gate layer 45 without etching the spacer layer 41. The dummy gate dielectric, when present, may be used as an etch stop layer when the dummy gate layer 45 is etched. The dummy gate dielectric may then be removed after the removal of the dummy gate layer 45.

The nanostructures 24 are removed to release the nanostructures 22. After the nanostructures 24 are removed, the nanostructures 22 form a plurality of nanosheets that extend horizontally (e.g., parallel to a major upper surface of the substrate 110). The nanosheets may be collectively referred to as the channels 22 of the GAA devices 20N, 20P formed.

In some embodiments, the nanostructures 24 are removed by a selective etching process using an etchant that is selective to the material of the nanostructures 24, such that the nanostructures 24 are removed without substantially attacking the nanostructures 22. In some embodiments, the etching process is an isotropic etching process using an etching gas, and optionally, a carrier gas, where the etching gas comprises F2 and HF, and the carrier gas may be an inert gas such as Ar, He, N2, combinations thereof, or the like.

In some embodiments, the nanostructures 24 are removed and the nanostructures 22 are patterned to form channel regions of both PFETs and NFETs, such as the GAA device 20P and the GAA device 20N, respectively. However, in some embodiments the nanostructures 24 may be removed and the nanostructures 22 may be patterned to form channel regions of the GAA device 20N, and nanostructures 22 may be removed and the nanostructures 24 may be patterned to form channel regions of the GAA device 20P. In some embodiments, the nanostructures 22 may be removed and the nanostructures 24 may be patterned to form channel regions of the GAA device 20N, and the nanostructures 24 may be removed and the nanostructures 22 may be patterned to form channel regions of the GAA device 20P. In some embodiments, the nanostructures 22 may be removed and the nanostructures 24 may be patterned to form channel regions of both PFETs and NFETs.

In some embodiments, the nanosheets 22 of the GAA devices 20N, 20P are reshaped (e.g. thinned) by a further etching process to improve gate fill window. The reshaping may be performed by an isotropic etching process selective to the nanosheets 22. After reshaping, the nanosheets 22 may exhibit the dog bone shape in which middle portions of the nanosheets 22 are thinner than peripheral portions of the nanosheets 22 along the X direction.

Figure 20:
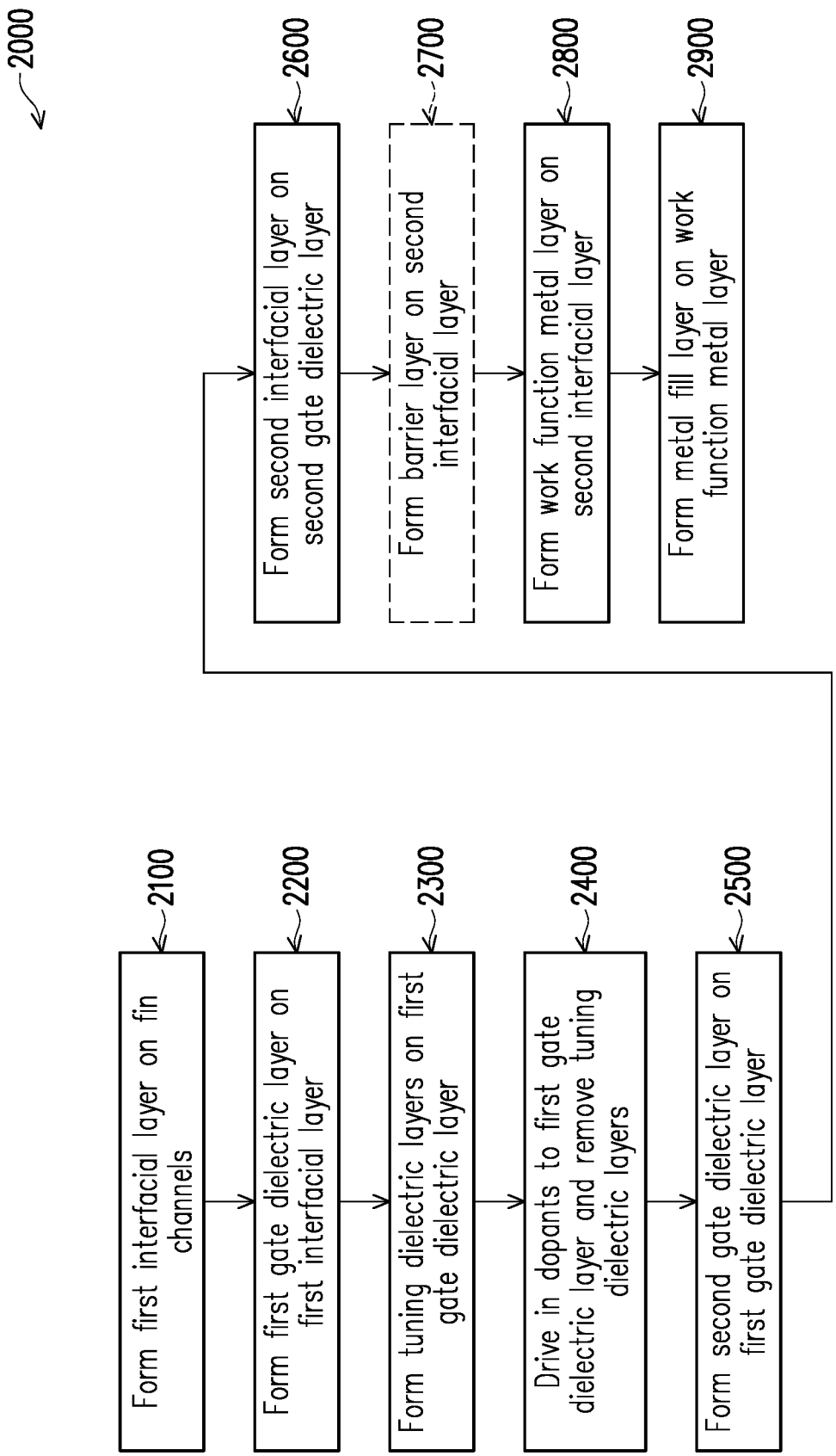
FIG. 20 is a flowchart illustrating a method of fabricating a semiconductor device according to various aspects of the present disclosure.
Figure 21:
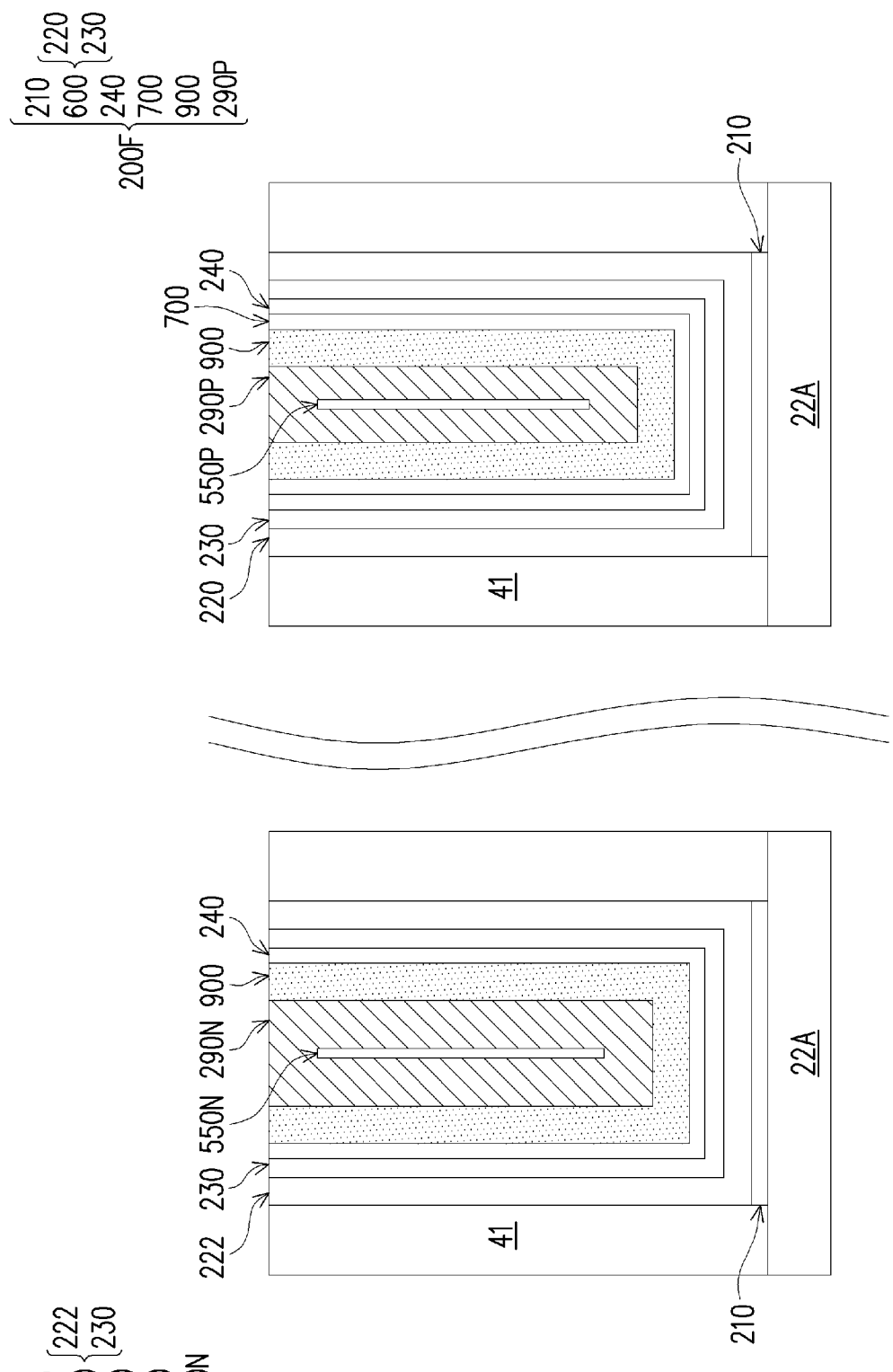
FIGS. 21-25 are diagrammatic cross-sectional side views of portions of an IC device fabricated according to embodiments of the present disclosure.

Next, in FIGS. 10A-10C, replacement gates 200, such as the gate structures 200A, 200F, are formed, corresponding to act 1600 of FIG. 11. Each replacement gate 200 generally includes the first IL layer 210, one of the first gate dielectric layer 222 or the first gate dielectric layer 220, the second gate dielectric layer 230, the second IL layer 240, the first work function metal layer 900, and the gate fill layer 290N or 290P. In some embodiments, the replacement gate 200 further includes the second work function layer 700. Cross-sections of formation of the gate structures 200A, 200F, as well as further gate structures 200B, 200C, 200D, and 200E are provided with respect to FIG. 12A through FIG. 19F. Flowcharts of methods of formation of the gate structures 200A-200F are illustrated in FIG. 20 and FIG. 21.

Additional processing may be performed to finish fabrication of the GAA device 20N and/or the GAA device 20P. For example, gate contacts (not illustrated for simplicity) and the source/drain contacts 120 may be formed to electrically couple to the gate structures 200A-200F and the source/drain regions 82, respectively, corresponding to act 1700 of FIG. 11. An interconnect structure may then be formed over the source/drain contacts 120 and the gate contacts corresponding to act 1800 of FIG. 11. The interconnect structure may include a plurality of dielectric layers surrounding metallic features, including conductive traces and conductive vias, which form electrical connection between devices on the substrate 110, such as the GAA devices 20N, 20P, as well as to IC devices external to the IC device 10.

FIG. 12A through FIG. 19F illustrate formation of the gate structures 200A-200F in accordance with various embodiments. FIGS. 12A, 13A, 14A, 15A, 16A, 17A, 18A, 19A illustrate formation of an N-type ultra low threshold voltage (N-uLVT) gate structure, such as the gate structure 200A. FIGS. 12B, 13B, 14B, 15B, 16B, 17B, 18B, 19B illustrate formation of an N-type low threshold voltage (N-LVT) gate structure, such as the gate structure 200B. FIGS. 12C, 13C, 14C, 15C, 16C, 17C, 18C, 19C illustrate formation of an N-type standard threshold voltage (N-SVT) gate structure, such as the gate structure 200C. FIGS. 12D, 13D, 14D, 15D, 16D, 17D, 18D, 19D illustrate formation of a P-type standard threshold voltage (P-SVT) gate structure, such as the gate structure 200D. FIGS. 12E, 13E, 14E, 15E, 16E, 17E, 18E, 19E illustrate formation of a P-type low threshold voltage (P-LVT) gate structure, such as the gate structure 200E. FIGS. 12F, 13F, 14F, 15F, 16F, 17F, 18F, 19F illustrate formation of a P-type ultra low threshold voltage (P-uLVT) gate structure, such as the gate structure 200F. FIG. 20 illustrates a flowchart of a process 2000 for forming the gate structures 200A-200F.

The gate structures 200A-200F may be formed on the same wafer and/or may be parts of the same IC device in some embodiments. As such, at least some of the fabrication processes discussed below may be performed to all the gate structure 200A-200F simultaneously. In FinFET embodiments, the gate structures 200A-200F may also be each formed over fin structures, such that the gate structures 200A-200F each wrap around a portion of the fin structures. In GAA FET embodiments, the gate structures 200A-200F may wrap around channel regions of the fin structures.

FIGS. 12A-12F illustrate the gate structures 200A-200F at an intermediate stage of fabrication, in which each gate structure 200A-200F includes the first IL 210 formed over the channels 22A-22C of FIG. 1, corresponding to act 2100 of FIG. 20. Only a fragmentary portion of the channel 22A is illustrated as an example in FIGS. 12A-19F for simplicity.

In some embodiments, the first IL 210 includes an oxide of the semiconductor material of the substrate 110, e.g. silicon oxide. In other embodiments, the first IL 210 may include another suitable type of dielectric material. The first IL 210 has a thickness 215 (measured in the Z-direction of FIG. 12A). In some embodiments, the thickness 215 is in a range between about 5 angstroms and about 50 angstroms. In some embodiments, the thickness 215 is about 10 angstroms.

Still referring to FIGS. 12A-12F, the first gate dielectric layer 220 is formed over the first IL 210, corresponding to act 2200 of FIG. 20. In some embodiments, an atomic layer deposition (ALD) process is used to form the first gate dielectric layer 220 to control thickness of the deposited first gate dielectric layer 220 with precision. In some embodiments, the ALD process is performed using between about 20 and 40 deposition cycles, at a temperature range between about 200 degrees Celsius and about 300 degrees Celsius. In some embodiments, the ALD process uses HfCl4 and/or H2O as precursors. Such an ALD process may form the first gate dielectric layer 220 to have a thickness 225, which may be in a range between about 5 angstroms and about 50 angstroms. In some embodiments, the thickness 225 is about 9 angstroms.

In some embodiments, and as described above with respect to FIG. 1, the first gate dielectric layer 220 includes a high-k dielectric material, which may refer to dielectric materials having a high dielectric constant that is greater than a dielectric constant of silicon oxide (k≈3.9). Exemplary high-k dielectric materials include $HfO_2$, HfSiO, HfSiON, HfTaO, HfTiO, HfZrO, $ZrO_2$, $Ta_2O_5$, or combinations thereof. In other embodiments, the first gate dielectric layer 220 may include a non-high-k dielectric material such as silicon oxide.

Referring now to FIGS. 13A-13F and FIGS. 14A-14F, tuning dielectric layers are formed on the first gate dielectric layers 220 of the gate structures 200A-200F, corresponding to act 2300 of FIG. 20. The tuning dielectric layers allow for tuning of threshold voltage in the gate structures 200A-200F. In more detail, a first tuning dielectric layer 300 is deposited directly on the first gate dielectric layer 220 in the gate structures 200A-200F. In some embodiments, the first tuning dielectric layer 300 may include a dipole material suitable for N-type devices (also referred to as an N-type dipole material), which may include a metal oxide material such as lanthanum oxide ($La_2O_3$), magnesium oxide (MgO), yttrium oxide ($Y_2O_3$), titanium oxide ($TiO_2$), or combinations thereof, as non-limiting examples. For the gate structures 200A-200C corresponding to N-type transistor devices, the N-type dipole material may decrease the threshold voltage Vt. For the gate structures 200D-200F corresponding to P-type transistor devices, the N-type dipole material may increase the threshold voltage Vt. In alternative embodiments where a P-type dipole material is used to implement the first tuning dielectric layer 300, the threshold voltage Vt will be increased for NFET devices such as the gate structures 200A-200C but will be decreased for PFET devices such as the gate structures 200D-200F. Example P-type dipole materials may include $Al_2O_3$, $Nb_2O_5$, or $B_2O_3$.

In some embodiments, the deposition process includes an atomic layer deposition (ALD) process. In some embodiments, the ALD process uses La(fAMD)3 or La(thd)3 and O3 as precursors. The ALD process allows a thickness 305 of the deposited first tuning dielectric layer 300 to be precisely controlled. In some embodiments, the thickness 305 is in a range between about 1 angstroms and about 15 angstroms. As shown in FIGS. 13A-13F, following deposition of the first tuning dielectric layer 300, a mask 310 is used in removal of the first tuning dielectric layer 300 from the gate structures 200B, 200C, 200E, 200F, such that the first tuning dielectric layer 300 remains on the gate structures 200A, 200D, as shown in FIGS. 14A-14F.

FIGS. 14A-14F illustrate deposition of a second tuning dielectric layer 400 on the gate structures 200A-200F, and formation of a mask 410 which covers the gate structures 200A, 200B, 200D, 200E, while exposing the gate structures 200C, 200F. Formation of the second tuning dielectric layer 400 may be substantially similar to that of the tuning dielectric layer 300, in some embodiments. The first tuning dielectric layer 300 and the second tuning dielectric layer 400 may be collectively referred to as tuning dielectric layers. The second tuning dielectric layer 400 is deposited directly on the first tuning dielectric layer 300 in the gate structures 200A, 200D, and is deposited directly on the first gate dielectric layer 220 in the gate structures 200B, 200C, 200E, 200F. The ALD process allows a thickness 405 of the deposited second tuning dielectric layer 400 to be precisely controlled. In some embodiments, the thickness 405 is in a range between about 1 angstroms and about 15 angstroms. In some embodiments, material of the second tuning dielectric layer 400 is the same as the material of the first tuning dielectric layer 300. In some embodiments, the material of the second tuning dielectric layer 400 is different from the material of the first tuning dielectric layer 300. For example, the first tuning dielectric layer 300 may be or comprise $La_2O_3$, and the second tuning dielectric layer 400 may be or comprise MgO.

As shown in FIGS. 14A-14F, following deposition of the second tuning dielectric layer 400, the mask 410 is used in removal of the second tuning dielectric layer 400 from the gate structures 200C, 200F, such that the second tuning dielectric layer 400 remains on the gate structures 200A, 200B, 200D, 200E, as shown in FIGS. 15A-15F.

Note that since both the first tuning dielectric layer 300 and the second tuning dielectric layer 400 are deposited on the gate structures 200A and 200D, the first gate dielectric layer 220 will experience the strongest effect for the gate structures 200A and 200D. Meanwhile, for the gate structures 200B and 200E, the first tuning dielectric layer 300 is not present. Thus, the first gate dielectric layer 220 may experience a weaker effect for the gate structures 200B and 200E. Lastly, for the gate structures 200C and 200F, the first tuning dielectric layer 300 and the second tuning dielectric layer 400 are both not present. As such, the first gate dielectric layer 220 may experience the weakest effect for the gate structures 200C and 200F.

As such, the multiple patterning processes discussed above result in different numbers of tuning dielectric layers overlying the first gate dielectric layers 220 of the gate structures 200A-200F. The N-uLVT and P-SVT transistors employ the greatest number of tuning dielectric layers on the first gate dielectric layer 220, and as such the tuning dielectric layers may exhibit the strongest effect to the first gate dielectric layer 220 for these transistors. The N-LVT and P-LVT transistors employ an intermediate number of tuning dielectric layers on the first gate dielectric layer 220, and as such the tuning dielectric layers may exhibit an intermediate amount of effect to the first gate dielectric layer 220 for these transistors. The N-SVT and P-uLVT transistors employ the fewest, or no, tuning dielectric layers on the first gate dielectric layer 220, and as such the tuning dielectric layers may exhibit the weakest, or no, effect to the first gate dielectric layer 220 for these transistors.

Referring now to FIGS. 15A-15F, a thermal drive-in process 500 is performed to the gate structures 200A-200F, corresponding to act 2400 of FIG. 20. In some embodiments, the thermal drive-in process 500 may include an annealing process. In some embodiments, the annealing process may be performed at an annealing temperature between about 600 degrees Celsius and about 800 degrees Celsius, while using a nitrogen gas. The annealing temperature causes the metal ions in the tuning dielectric layers 300, 400 to penetrate into (or react with) the first gate dielectric layer 220. The metal ions may increase the polarity of the first gate dielectric layer 220, and thus can be used to adjust the threshold voltage Vt of the gate structures 200A-200F. This change in composition of the first gate dielectric layer 220 is represented in the figures by the first gate dielectric layer 221 and the first gate dielectric layer 222. As described above, dopant concentration is highest in the first gate dielectric layer 222, and lowest or zero in the first gate dielectric layer 220. Dopant concentration in the first gate dielectric layer 221 is lower than in the first gate dielectric layer 222, and higher than in the first gate dielectric layer 220.

It is understood that within each of the first gate dielectric layers 222, 221, 220, the concentration of the dopant material (e.g., the metal ions) may be at its peak at a surface of the first gate dielectric layers 222, 221, 220 nearest the tuning dielectric layers, and then gradually decline as the distance from the surface increases (e.g., nearer the channels 22A-22C).

Differences in dopant penetration may be represented by different depths in which the dopants penetrate into the first gate dielectric layers 220, 221, 222. For example, the dopants may penetrate furthest into the first gate dielectric layer 222. The dopants may penetrate least, or be entirely not present, in the first gate dielectric layer 220. Penetration of the dopants into the first gate dielectric layer 221 may be less than that of the first gate dielectric layer 222 and greater than that of the first gate dielectric layer 220.

Referring now to FIGS. 16A-16F, the tuning dielectric layers 300, 400 are removed, corresponding to act 2400 of FIG. 20. In some embodiments, the removal process includes an etching process, such as a wet etching process, a dry etching process, or a combination thereof. In some embodiments, an etchant used in such an etching process may include hydrochloric acid (HCl), alkali (NH4), oxidant, or another suitable etchant. Removal of the tuning dielectric layers 300, 400 improves gate fill window, while already having accorded the benefit of varying levels of dopant concentration to the first gate dielectric layers 222, 221, 220, which corresponds to varying threshold voltages of the gate structures 200A-200F.

Further in FIGS. 16A-16F, the second gate dielectric layer 230 is deposited on the first gate dielectric layers 222, 221, 220, corresponding to act 2500 of FIG. 20. The second gate dielectric layer 230 may reduce gate leakage. In some embodiments, an atomic layer deposition (ALD) process similar to that used to form the first gate dielectric layer 220 is used to form the second gate dielectric layer 230 with precisely-controlled thickness. The second gate dielectric layer 230 has a thickness 235, which may be in a range between about 5 angstroms and about 50 angstroms. In some embodiments, the thickness 235 is about 6 angstroms. In some embodiments, fewer ALD deposition cycles are used to deposit the second gate dielectric layer 230 than are used to deposit the first gate dielectric layer 220, such that the second gate dielectric layer 230 is generally thinner than the first gate dielectric layer 220. Material of the second gate dielectric layer 230 may be substantially the same as that of the first gate dielectric layer 220, in some embodiments. In other embodiments, the material of the second gate dielectric layer 230 is different from the material of the first gate dielectric layer 220.

FIGS. 17A-17F illustrate formation of a second IL 240 on the second gate dielectric layer 230, and the work function barrier layer 700 on the second IL 240, which corresponds to acts 2600 and 2700 respectively of FIG. 20. The second IL 240 promotes better metal gate adhesion on the second gate dielectric layer 230. In many embodiments, the second IL 240 further provides improved thermal stability for the gate structures 200A-200F, and serves to limit diffusion of metallic impurity from the work function metal layers 900 and/or the work function barrier layer 700 into the first gate dielectric layer 222, 221, 220 and the second gate dielectric layer 230. In some embodiments, formation of the second IL 240 is accomplished by first depositing a high-k capping layer (not illustrated for simplicity) on the second gate dielectric layer 230. The high-k capping layer comprises one or more of the following: HfSiON, HfTaO, HfTiO, HfTaO, HfAlON, HfZrO, or other suitable materials, in various embodiments. In a specific embodiment, the high-k capping layer comprises titanium silicon nitride (TiSiN). In some embodiments, the high-k capping layer is deposited by an ALD using about 40 to about 100 cycles at a temperature of about 400 degrees C. to about 450 degrees C. A thermal anneal is then performed to form the second IL 240, which may be or comprise TiSiNO, in some embodiments. Following formation of the second IL 240 by thermal anneal, an atomic layer etch (ALE) with artificial intelligence (AI) control is performed in cycles to remove the high-k capping layer while substantially not removing the second IL 240. Each cycle may include a first pulse of $WCl_5$, followed by an Ar purge, followed by a second pulse of $O_2$, followed by another Ar purge. The AI control is discussed in greater detail with respect to FIG. 26. The high-k capping layer is removed to increase gate fill window for further multiple threshold voltage tuning by metal gate patterning.

Further in FIGS. 17A-17F, after forming the second IL 240 and removing the high-k capping layer, the work function barrier layer 700 is optionally formed on the gate structures 200A-200F, in accordance with some embodiments, which corresponds to act 2700 of FIG. 20. The work function barrier layer 700 is or comprises a metal nitride, such as TiN, WN, MoN, TaN, or the like. In a specific embodiment, the work function barrier layer 700 is TiN. The work function barrier layer 700 may have thickness 705 ranging from about 5 A to about 20 A. Inclusion of the work function barrier layer 700 provides additional threshold voltage tuning flexibility. In general, the work function barrier layer 700 increases the threshold voltage for NFET transistor devices, and decreases the threshold voltage (magnitude) for PFET transistor devices. As shown in FIGS. 17A-17F, after formation of the work function barrier layer 700, a mask 710 is formed over the gate structures 200D-200F, while exposing the gate structures 200A-200C. In some embodiments, the mask 710 may be formed over the gate structures 200A, 200D, while exposing the gate structures 200B, 200C, 200E, 200F. Formation of the mask 710 may include at least one photoresist deposition process followed by an exposure and removal process. The mask 710 is utilized in removal of the work function barrier layer 700 from gate structures exposed by the mask 710, such as the gate structures 200A-200C, as shown in FIGS. 17A-17C. In some embodiments, the deposition and patterning of the work function barrier layer 700 may be repeated to form varying numbers of the work function barrier layer 700 on the gate structures 200A-200F, so as to achieve variable threshold voltage tuning among the gate structures 200A-200F. In some embodiments, each of the gate structures 200A-200F may include as few as zero of the work function barrier layers 700 to three or more of the work function barrier layers 700. Fewer of the work function barrier layers 700 allows for larger gate fill window, whereas a greater number of the work function barrier layers 700 allows for enhanced threshold voltage tuning.

FIGS. 18A-18F illustrate the gate structures 200A-200F with the work function barrier layers 700 in place for the gate structures 200D-200F and removed for the gate structures 200A-200C. Further illustrated are formation of the N-type work function metal layer 250, the in-situ capping layer 260, and the oxygen blocking layer 270 (corresponding to act 2800 of FIG. 20), which may be collectively referred to as the work function metal layer 900. In some embodiments, the N-type work function metal layer 250 is or comprises an N-type metal material, such as TiAlC, TiAl, TaAlC, TaAl, or the like. The N-type work function metal layer 250 may be formed by one or more deposition methods, such as CVD, PVD, ALD, plating, and/or other suitable methods, and has a thickness 255 of between about 10 A and 20 A.

The in-situ capping layer 260 is formed on the N-type work function metal layer 250. In some embodiments, the in-situ capping layer 260 is or comprises TiN, TiSiN, TaN, or another suitable material, and has a thickness 265 between about 10 A and 20 A. The oxygen blocking layer 270 is formed on the in-situ capping layer 260 to prevent oxygen diffusion into the N-type work function metal layer 250, which would cause an undesirable shift in the threshold voltage. The oxygen blocking layer 270 is formed of a dielectric material that can stop oxygen from penetrating to the N-type work function metal layer 250, and may protect the N-type work function metal layer 250 from further oxidation. The oxygen blocking layer 270 may include an oxide of silicon, germanium, SiGe, or another suitable material. In some embodiments, the oxygen blocking layer 270 is formed using ALD and has a thickness 275 between about 10 A and about 20 A.

FIGS. 19A-19F illustrate the gate structures 200A-200F after formation of a glue layer 280 and the metal fill layers 290N, 290P, corresponding to act 2900 of FIG. 20. In some embodiments, the glue layer 280 is formed on the oxygen blocking layer 270 of the work function metal layer 900. The glue layer 280 may promote and/or enhance the adhesion between the metal fill layers 290N, 290P and the work function metal layer 900. In some embodiments, the glue layer 280 may be formed of a metal nitride, such as TiN, TaN, MoN, WN, or another suitable material, using ALD. In some embodiments, thickness 285 of the glue layer 280 is between about 10 A and about 25 A.

The metal fill layers 290N, 290P are formed on the glue layer 280, and may include a conductive material such as tungsten, cobalt, ruthenium, iridium, molybdenum, copper, aluminum, or combinations thereof. In some embodiments, the metal fill layers 290N, 290P may be deposited using methods such as CVD, PVD, plating, and/or other suitable processes. As shown in FIGS. 19A-19F, the metal fill layers 290N may have thickness 295N that is thicker than thickness 295P of the metal fill layers 290P, as a result of inclusion of the work function barrier layer(s) 700 in the gate structures 200D-200F. Similarly, with reference to FIG. 1, the metal fill layer 290P is narrower in the X direction than the metal fill layer 290N.

FIGS. 21-25 illustrate the gate structures 200A, 200F in accordance with certain other embodiments.

Figure 23:
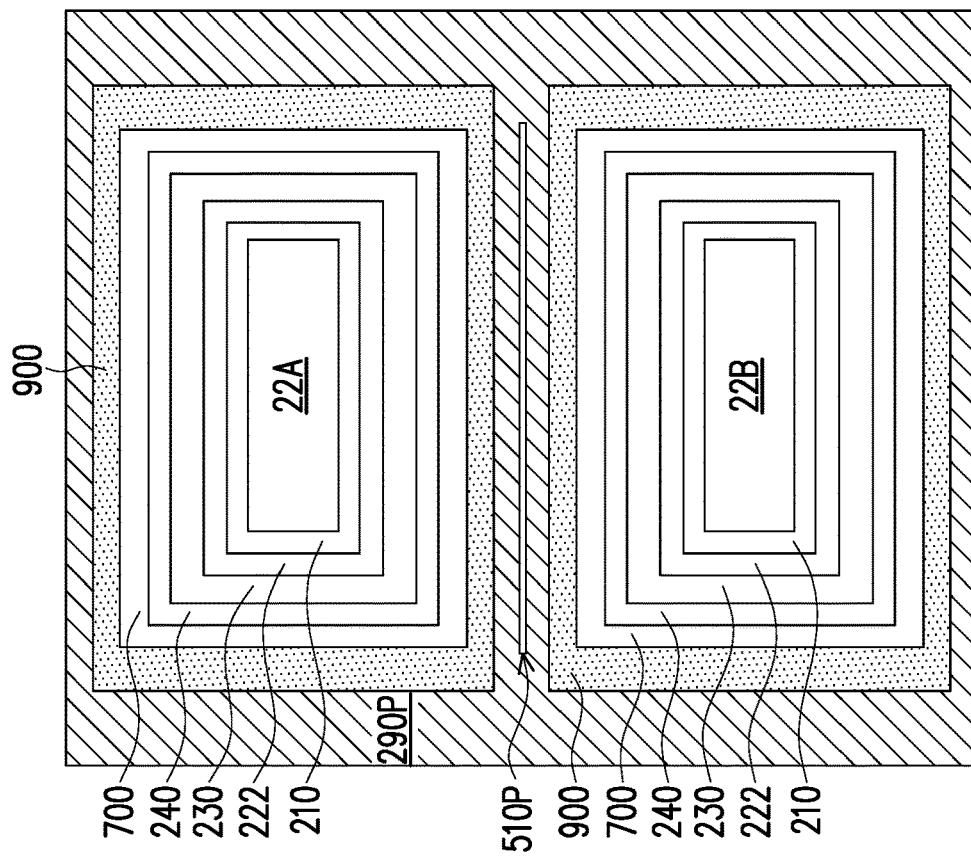
Figure 22:
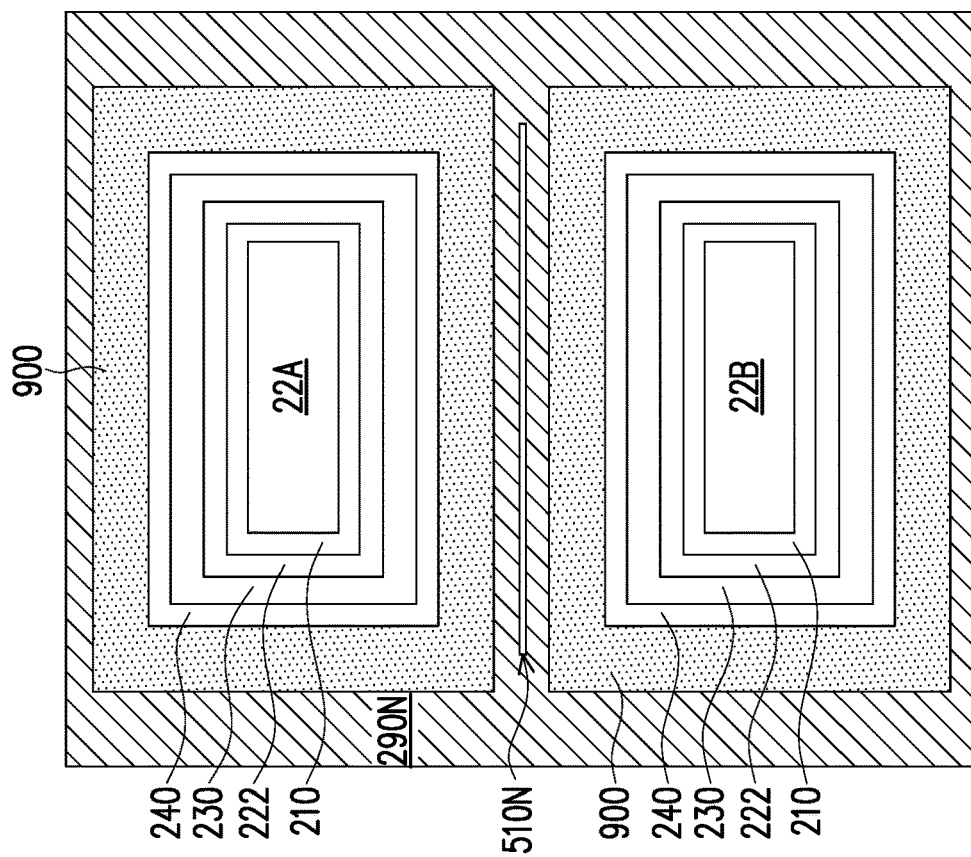

Referring to FIG. 21, as illustrated, a seam 550N may be formed in the metal fill layer 290N. Similarly, a seam 550P may be formed in the metal fill layer 290P. In some embodiments, the metal fill layers 290N, 290P are conformally deposited on the work function metal layer 900. The seams 550N, 550P may form due to sidewall deposited film merging during the conformal deposition. The illustration of FIG. 21 shows the portions of the gate structures 200A, 200F above the channel 22A. FIGS. 22 and 23 illustrate seams 510N, 510P that may form for similar reasons between neighboring channels, such as the channels 22A and the channels 22B, as shown. In some embodiments, the seams 510N, 510P are present between the neighboring channels, while the seams 550N, 550P are not present above the channels 22A.

Figure 24:
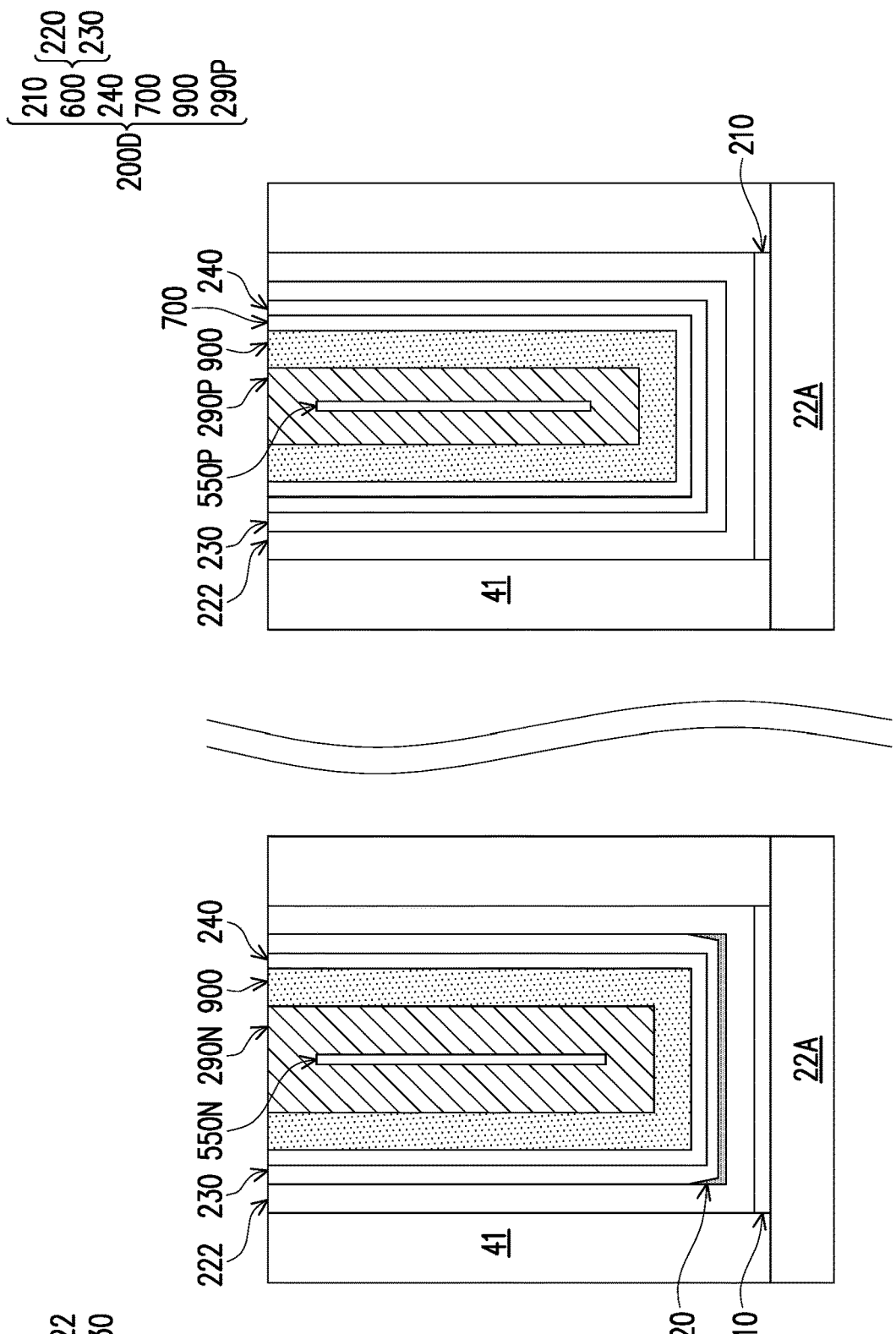

FIG. 24 illustrates tuning dielectric layer residue 320 in the gate structure 200A. In some embodiments, removal of the tuning dielectric layers 300, 400 is not complete, leaving the tuning dielectric layer residue 320 in the gate structure 200A. In some embodiments, the tuning dielectric layer residue 320 is present on sidewalls of the first gate dielectric layer 222 and the second gate dielectric layer 230. In some embodiments, the tuning dielectric layer residue 320 is also present between a bottom surface of the second gate dielectric layer 230 and a top surface of the first gate dielectric layer 222. The tuning dielectric layer residue 320 may shift the threshold voltage. In some embodiments, the tuning dielectric layer residue 320 is not present in the gate structure 200D, as shown.

Figure 25:
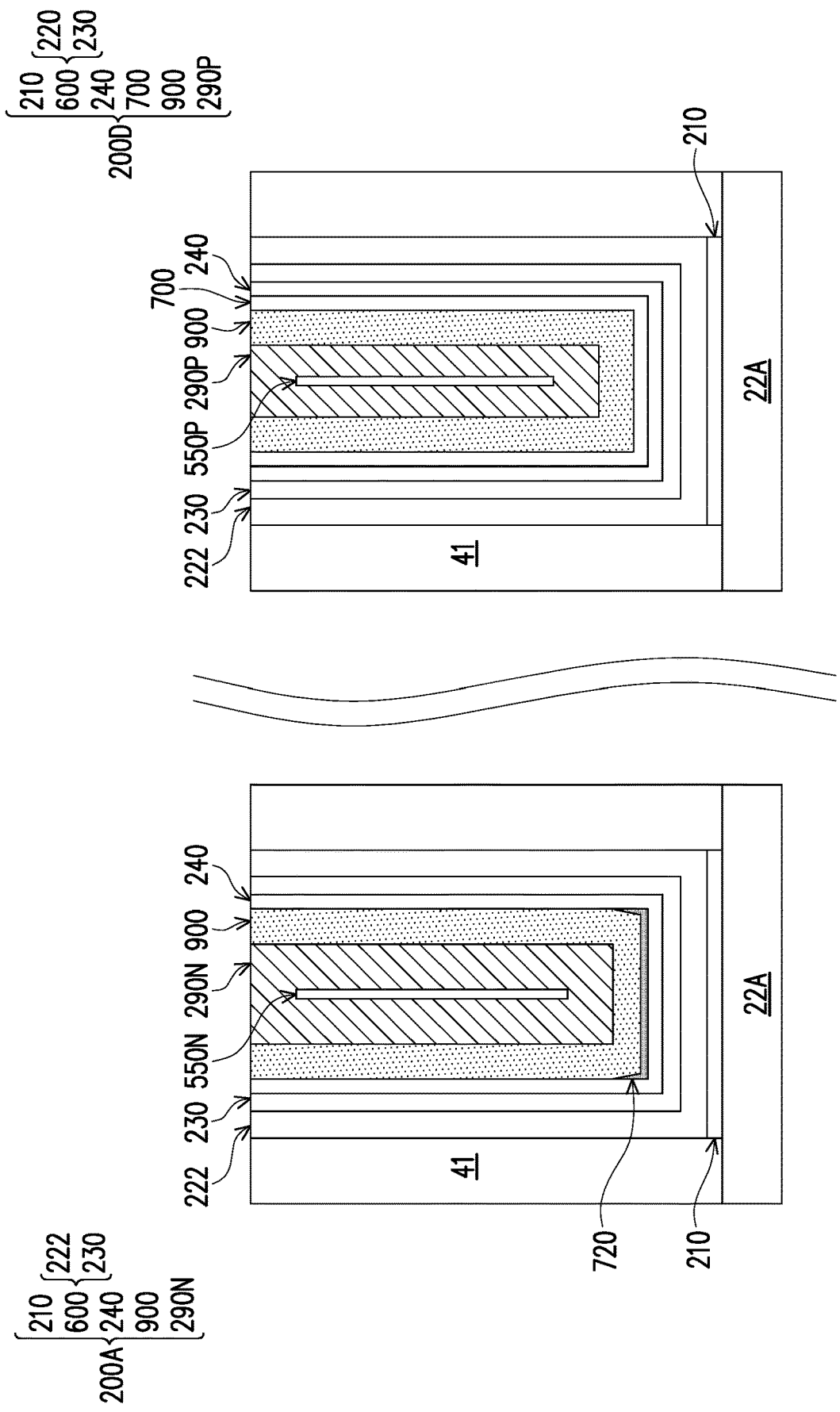

FIG. 25 illustrates work function barrier layer residue 720 in the gate structure 200A. In some embodiments, removal of the work function barrier layer 700 is not complete, leaving the work function barrier layer residue 720 in the gate structure 200A. In some embodiments, the work function barrier layer residue 720 is present on sidewalls of the second IL 240 and the work function metal layer 900. In some embodiments, the work function barrier layer residue 720 is also present between a bottom surface of the work function metal layer 900 and a top surface of the second IL 240. The work function barrier layer residue 720 may shift the threshold voltage. In some embodiments, the work function barrier layer residue 720 is not present in the gate structure 200D, as shown.

Figure 26:
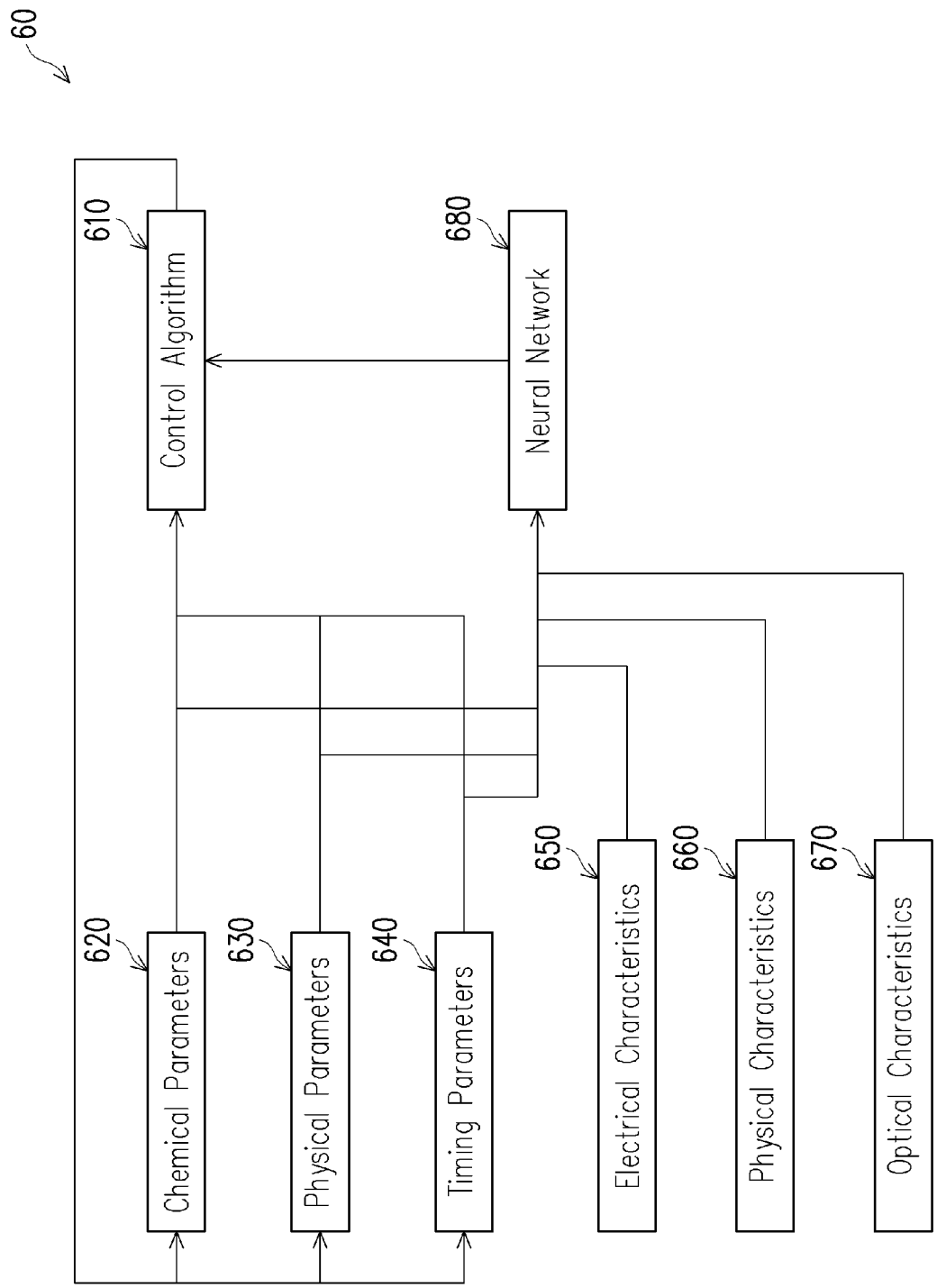
FIG. 26 is a diagram of a process for fabricating a semiconductor device layer according to various aspects of the present disclosure.

FIG. 26 illustrates a process 60 for AI control of the ALE process used to form the second IL 240 described with respect to FIGS. 17A-17F. In some embodiments, ALE process parameters 62 include at least chemical parameters 620, physical parameters 630, and/or timing parameters 640. The chemical parameters 620 may comprise at least one of raw material parameters such as chemical composition, state information (solid, liquid, gas, or phase mixture), light adsorption/reflection, carrier gas condition, and/or lifetime, and the like. The physical parameters 630 may include at least temperature, humidity, pressure, pipe length, and the like. The timing parameters 640 may include cycle length, cycle number, and the like. The ALE process parameters 62 may further include ampoule lifetime/condition, chamber life time, effective etching density, effective etching area size grouping/distribution, last etching feedback, and the like. The ALE process parameters 62 may further comprise other parameters, such as target device pattern density, exposed effective plain area, exposed effective plain area crystal orientation, exposed effective plain area roughness index, exposed effective sidewall area, exposed effective sidewall tilt angle, wafer rotation/tilt parameters, and the like.

In some embodiments, all or a portion of the ALE process parameters 62 are set prior to each run or each cycle. A single run may include multiple cycles. For example, as described with respect to FIGS. 17A-17F, following formation of the second IL 240 by thermal anneal, the atomic layer etch (ALE) with artificial intelligence (AI) control is performed in cycles to remove the high-k capping layer while substantially not removing the second IL 240. Each cycle may include a first pulse of WCl5, followed by an Ar purge, followed by a second pulse of O2, followed by another Ar purge. The ALE process is performed using the ALE process parameters 62.

Measured characteristics 66 may include electrical characteristics 650, physical characteristics 660, optical characteristics 670, and the like. At least some of the measured characteristics 66 may be measured during the ALE process, such as during each cycle of the ALE process. At least some of the measured characteristics 66 may be measured following each cycle of the ALE process. Further, at least some of the measured characteristics 66 may be measured upon or after completion of all cycles of the ALE process. For example, the electrical characteristics 650, which may include resistivity, threshold voltage, parasitic capacitances, and the like, may be measured upon completion of an integrated circuit (IC) chip including the GAA devices 20N, 20P. Certain physical characteristics 660, such as layer thickness, may be measured by in-process metrological tools during performance of the ALE process.

The ALE process parameters 62 and the measured characteristics 66 are used to train and/or update a neural network 680, which is utilized to generate and/or update a control algorithm 610 based on various machine learning techniques. The control algorithm 610 is configured to perform dynamic tuning of the ALE process parameters 62. The control algorithm 610 may be updated periodically, for example after a number of runs, such as every 1000 runs, or some other appropriate period. Use of the control algorithm 610 allows for highly precise removal of the high-k capping layer from the second IL 240.

Embodiments may provide advantages. The gate structures 200A-200F improve gate fill window, and achieve lower gate resistance, while providing multiple Vt tuning with photolithographic patterning. The multiple Vt tuning is achieved by selectively driving in dopants to the first high-k dielectric layer 220 of each of the gate structures 200A-200F at various concentrations effective to tune the various threshold voltages. Gate leakage may be reduced by depositing the second high-k dielectric layer 230 on the first high-k dielectric layers 222, 221, 220. AI-controlled ALE promotes high-precision removal of the high-k capping layer used to form the second IL 240, which frees up gate fill window to include the work function barrier layer 700 for further tuning of the threshold voltages. These techniques improve the flexibility in tuning the threshold voltage.

In accordance with at least one embodiment, a device comprises a substrate, a semiconductor channel over the substrate, and a gate structure over and laterally surrounding the semiconductor channel. The gate structure comprises a first dielectric layer comprising a first dielectric material including dopants. A second dielectric layer is on the first dielectric layer, and comprises a second dielectric material substantially free of the dopants. A metal fill layer is over the second dielectric layer.

In accordance with at least one embodiment, a device comprises a first gate structure and a second gate structure. The first gate structure comprises a first dielectric layer comprising a first dielectric material including dopants. A second dielectric layer is on the first dielectric layer, and comprises a second dielectric material substantially free of the dopants. A first metal fill layer is over the second dielectric layer. The second gate structure comprises a third dielectric layer comprising a third dielectric material. Concentration of dopants in the third dielectric material is different than concentration of dopants in the first dielectric material. A fourth dielectric layer is on the third dielectric layer, and comprises a fourth dielectric material substantially free of the dopants. A second metal fill layer is over the fourth dielectric layer.

In accordance with at least one embodiment, a method comprises forming a tuning dielectric layer over a first dielectric layer. The first dielectric layer is over a first channel of a first gate structure and a second channel of a second gate structure. The tuning dielectric layer over the second channel is removed. Dopants from the tuning dielectric layer are driven in to the first dielectric layer over the first channel. The tuning dielectric layer over the first dielectric layer is removed. A second dielectric layer is formed over the first dielectric layer, and a metal fill layer is formed over the second dielectric layer.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A device, comprising:
   a substrate;
   a semiconductor channel over the substrate; and
   a gate structure over and laterally surrounding the semiconductor channel, comprising:
      a first dielectric layer comprising a first dielectric material including dopants;
      a second dielectric layer on the first dielectric layer, and comprising a second dielectric material substantially free of the dopants; and
      a metal fill layer over the second dielectric layer, wherein a greatest concentration of the dopants decreases as a distance from the metal fill layer increases.

2. The device of claim 1, wherein the dopants include at least one of ions of lanthanum, magnesium, yttrium, titanium, aluminum, niobium or boron.

3. The device of claim 1, wherein the gate structure further comprises:
   a work function metal layer between the second dielectric layer and the metal fill layer; and
   a work function barrier layer between the work function metal layer and the second dielectric layer.

4. The device of claim 3, wherein the work function barrier layer comprises at least one of TiN, WN, MoN, or TaN.

5. The device of claim 1, wherein the gate structure further comprises:
   a work function metal layer between the second dielectric layer and the metal fill layer;
   a first interfacial layer between the first dielectric layer and the semiconductor channel; and
   a second interfacial layer between the work function metal layer and the second dielectric layer.

6. The device of claim 1, wherein the device includes a FinFET device or a gate-all-around device.

7. The device of claim 1, wherein the dopants include at least one of ions of titanium, niobium or boron.

8. A device, comprising:
   a first gate structure comprising:
      a first dielectric layer comprising a first dielectric material including dopants;
      a second dielectric layer on the first dielectric layer, and comprising a second dielectric material substantially free of the dopants; and
      a first metal fill layer over the second dielectric layer; and
   a second gate structure comprising:
      a third dielectric layer comprising a third dielectric material, wherein concentration of dopants in the third dielectric material is different than concentration of dopants in the first dielectric material;
a fourth dielectric layer on the third dielectric layer, and comprising a fourth dielectric material substantially free of the dopants; and
a second metal fill layer over the fourth dielectric layer.

9. The device of claim 8, wherein the third dielectric material is substantially free of the dopants.

10. The device of claim 8, further comprising:
a third gate structure including:
  a fifth dielectric layer having a fifth dielectric material;
  a sixth dielectric layer over the fifth dielectric layer; and
  a third metal fill layer over the sixth dielectric layer;
wherein concentration of dopants in the fifth dielectric material is different than the concentration of dopants in the first dielectric material and the concentration of dopants in the third dielectric material.

11. The device of claim 10, wherein:
the first gate structure further comprises a first work function metal layer between the second dielectric layer and the first metal fill layer;
the second gate structure further comprises a second work function metal layer having substantially the same composition as the first work function metal layer, the second work function metal layer between the fourth dielectric layer and the second metal fill layer; and
the third gate structure further comprises:
  a third work function metal layer having substantially the same composition as the first work function metal layer, the third work function metal layer between the sixth dielectric layer and the third metal fill layer; and
  a work function barrier layer between the third work function metal layer and the sixth dielectric layer.

12. The device of claim 11, wherein the first work function metal layer includes:
an N-type work function metal layer;
an in-situ capping layer on the N-type work function metal layer; and
an oxygen blocking layer on the in-situ capping layer.

13. The device of claim 11, wherein the first gate structure further comprises an interfacial layer between the first work function metal layer and the second dielectric layer, the interfacial layer comprising TiSiNO.

14. A method, comprising:
forming a tuning dielectric layer over a first dielectric layer, wherein the first dielectric layer is over a first channel of a first gate structure and a second channel of a second gate structure;
removing the tuning dielectric layer over the second channel;
driving in dopants from the tuning dielectric layer to the first dielectric layer over the first channel;
removing the tuning dielectric layer over the first dielectric layer;
forming a second dielectric layer over the first dielectric layer; and
forming a metal fill layer over the second dielectric layer.

15. The method of claim 14, further comprising:
forming a work function barrier layer over the second dielectric layer before forming the metal fill layer; and
forming a work function metal layer over the work function barrier layer before forming the metal fill layer.

16. The method of claim 14, further comprising:
forming a first interfacial layer on the first channel and the second channel before forming the tuning dielectric layer; and
forming a second interfacial layer on the second dielectric layer before forming the metal fill layer.

17. The method of claim 16, wherein forming the second interfacial layer includes:
forming a high-k capping layer on the second dielectric layer;
forming the second interfacial layer by a thermal anneal performed on the high-k capping layer; and
removing the high-k capping layer by an artificial-intelligence-controlled atomic layer etch process.

18. The method of claim 14, further comprising:
forming a second tuning dielectric layer over the first channel and the second channel after removing the tuning dielectric layer over the second channel, and before driving in the dopants; and
driving in dopants from the second tuning dielectric layer to the first dielectric layer over the first channel and the first dielectric layer over the second channel.

19. The method of claim 14, further comprising:
forming a work function metal layer over the second dielectric layer before forming the metal fill layer, comprising:
  forming an N-type work function metal layer;
  forming an in-situ capping layer on the N-type work function metal layer; and
  forming an oxygen blocking layer on the in-situ capping layer.

20. The method of claim 19, further comprising:
forming a glue layer on the work function metal layer;
wherein the metal fill layer is formed on the glue layer.

* * * * *